United States Patent
Li et al.

(10) Patent No.: US 10,572,380 B2
(45) Date of Patent: Feb. 25, 2020

(54) STRUCTURES OF BOTTOM SELECT TRANSISTOR FOR EMBEDDING 3D-NAND IN BEOL AND METHODS

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventors: Shan Rong Li, Shanghai (CN); Min-Hwa Chi, Shanghai (CN); Sheng Fen Chiu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/688,569

(22) Filed: Aug. 28, 2017

(65) Prior Publication Data

US 2018/0121345 A1    May 3, 2018

(30) Foreign Application Priority Data

Oct. 31, 2016    (CN) .......................... 2016 1 0925895

(51) Int. Cl.
*G11C 16/04*    (2006.01)
*G06F 12/02*    (2006.01)
(Continued)

(52) U.S. Cl.
CPC .......... *G06F 12/0246* (2013.01); *G11C 16/10* (2013.01); *G11C 16/26* (2013.01); *G11C 16/0483* (2013.01)

(58) Field of Classification Search
CPC .......... G06F 12/0246; H01L 27/11582; H01L 27/1157; G11C 16/10; G11C 16/0483; G11C 16/26
(Continued)

(56) References Cited

U.S. PATENT DOCUMENTS

2004/0125265 A1* 7/2004 Koo ........................ C30B 1/023
349/56
2009/0283819 A1* 11/2009 Ishikawa ........... H01L 27/11578
257/324
(Continued)

FOREIGN PATENT DOCUMENTS

CN    108122924    6/2018

OTHER PUBLICATIONS

European Application No. 17199135.9, Partial European Search Report dated Mar. 26, 2018, 15 pages.
(Continued)

*Primary Examiner* — Tha-O H Bui
(74) *Attorney, Agent, or Firm* — Kilpatrick Townsend & Stockton LLP

(57) ABSTRACT

A flash memory device includes a substrate, an electrode layer on a portion of the substrate, the electrode layer being a work function adjusting layer or a metal silicide layer, and a memory cell. The memory cell includes a channel structure on the electrode layer and having, from the inside to the outside in this order, a channel layer in contact with the electrode layer, a tunneling insulator layer surrounding the channel layer, a charge trapping layer surrounding the tunneling insulator layer, and a barrier layer surrounding the
(Continued)

charge trapping layer, and a plurality of gate structures surrounding the channel structure along an axial direction of the channel structure. The flash memory device may be formed on a dielectric layer, and its fabrication process is thus compatible with back end of line processes.

20 Claims, 17 Drawing Sheets

(51) Int. Cl.
*G11C 16/10* (2006.01)
*G11C 16/26* (2006.01)

(58) Field of Classification Search
USPC .................................................. 365/185.33
See application file for complete search history.

(56) References Cited

U.S. PATENT DOCUMENTS

| | | | |
|---|---|---|---|
| 2011/0298038 A1* | 12/2011 | Son | H01L 27/11578 257/324 |
| 2013/0168757 A1* | 7/2013 | Hong | H01L 29/7926 257/324 |
| 2013/0264626 A1* | 10/2013 | Sawa | H01L 29/66825 257/316 |
| 2014/0167131 A1 | 6/2014 | Lu et al. | |
| 2015/0140753 A1* | 5/2015 | Simsek-Ege | H01L 27/1157 438/268 |

OTHER PUBLICATIONS

Chen et al., Schottky Barrier Controlled Conduction in Poly-Si TFTs With Metal Source and Drain, IEEE Transactions on Electron Devices, vol. 60, No. 6, Jun. 2013, pp. 1958-1964.
Jang et al., Vertical Cell Array using TCAT(Terabit Cell Array Transistor) Technology for Ultra High Density NAND Flash Memory, Symposium on VLSI Technology Digest of Technical Papers, 2009, 2 pages.
Kim et al., Electrical Characteristics of MILC Poly-Si TFTs With Long Ni-Offset Structure, IEEE Transactions on Electron Devices, vol. 50, No. 12, Dec. 2003, pp. 2344-2347.
Cheng et al., Modeling of Grain Growth Mechanism by Nickel Silicide Reactive Grain Boundary Effect in Metal-Induced-Lateral-Crystallization, IEEE Transactions on Electron Devices, vol. 50, No. 6, Jun. 1, 2003, pp. 1467-1474.
EP17199135.9 , "Extended European Search Report", dated Jun. 18, 2016, 16 pages.
Joo, Understanding of Metal-Induced Lateral Crystallization Mechanism—A Low Temperature Crystallization Phenomenon, Electronic Materials Letters, vol. 1, No. 1, Jan. 1, 2005, pp. 7-10.

* cited by examiner

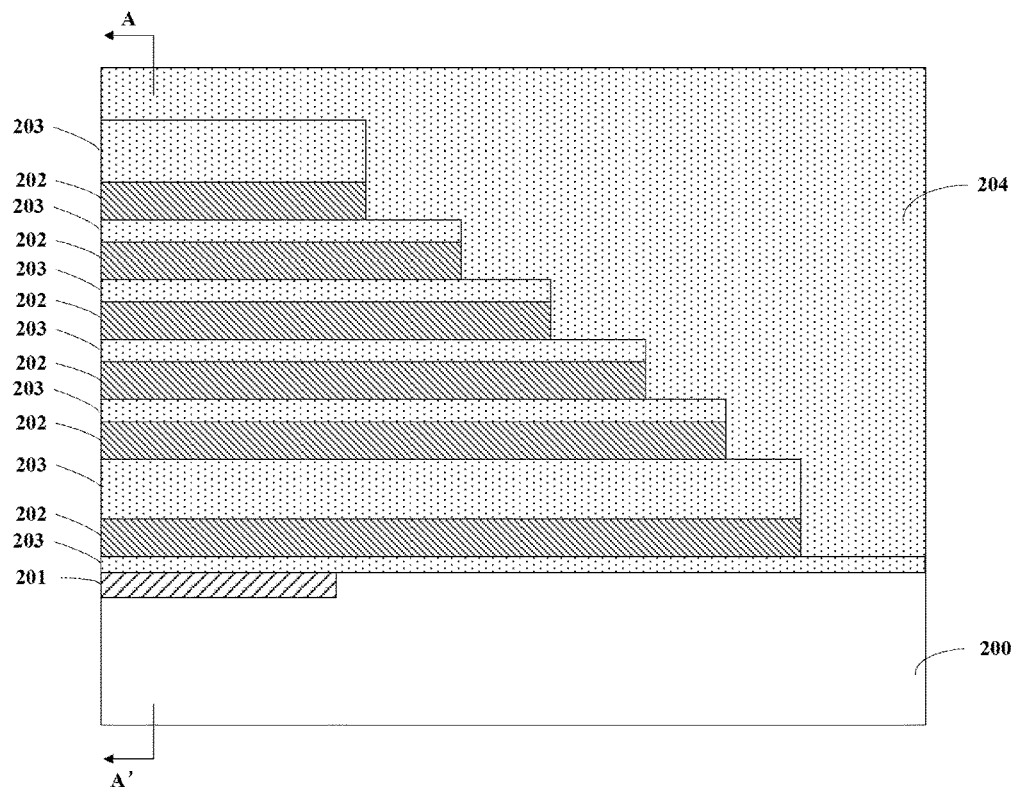
FIG. 2C1
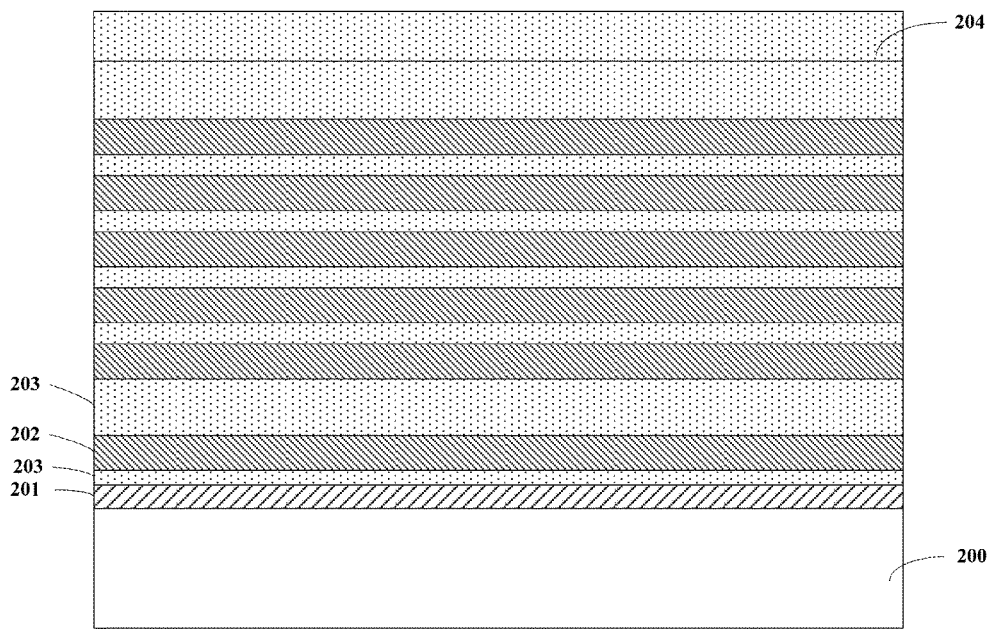
FIG. 2C2

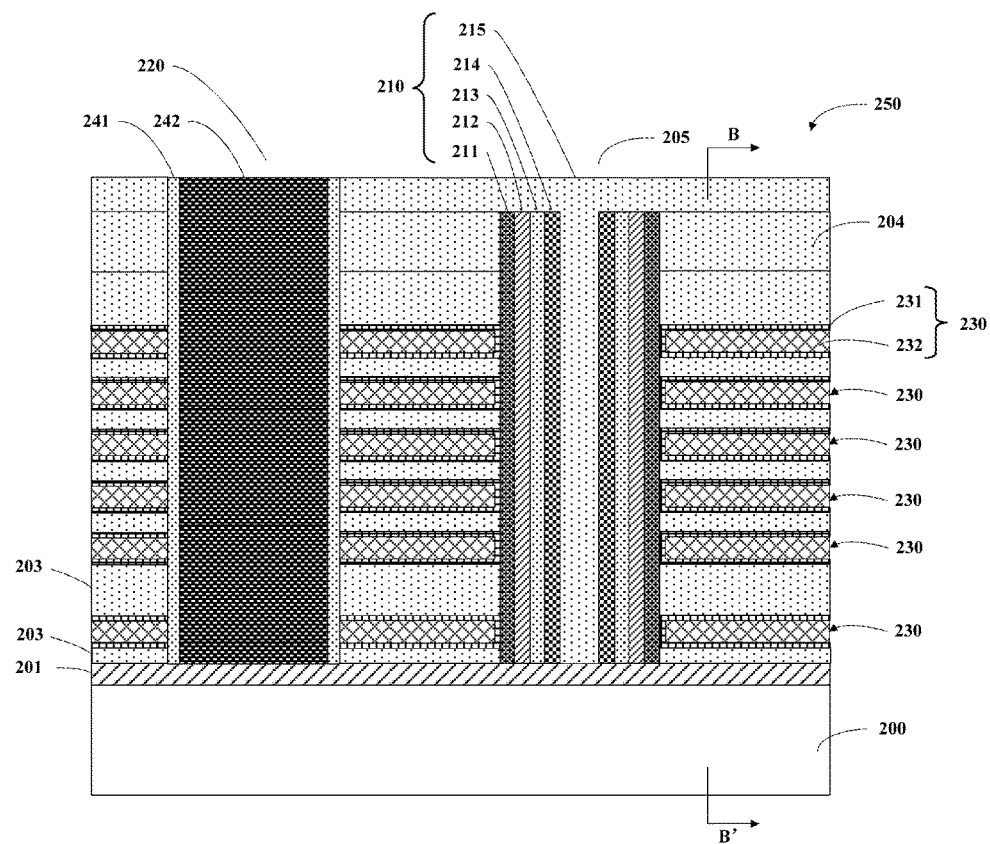
FIG. 2L1
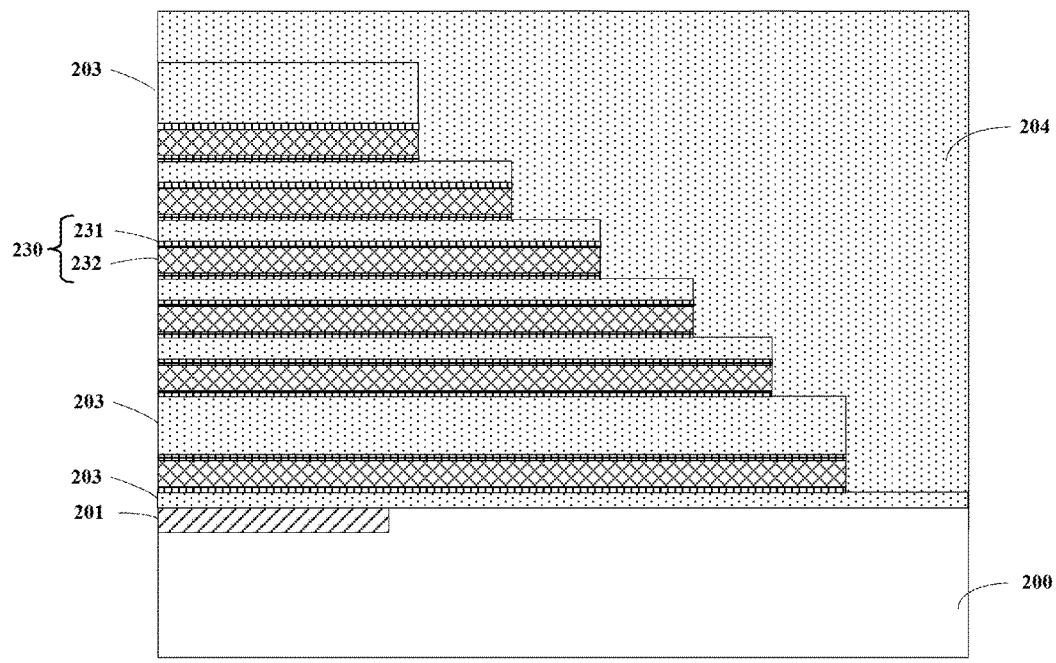
FIG. 2L2

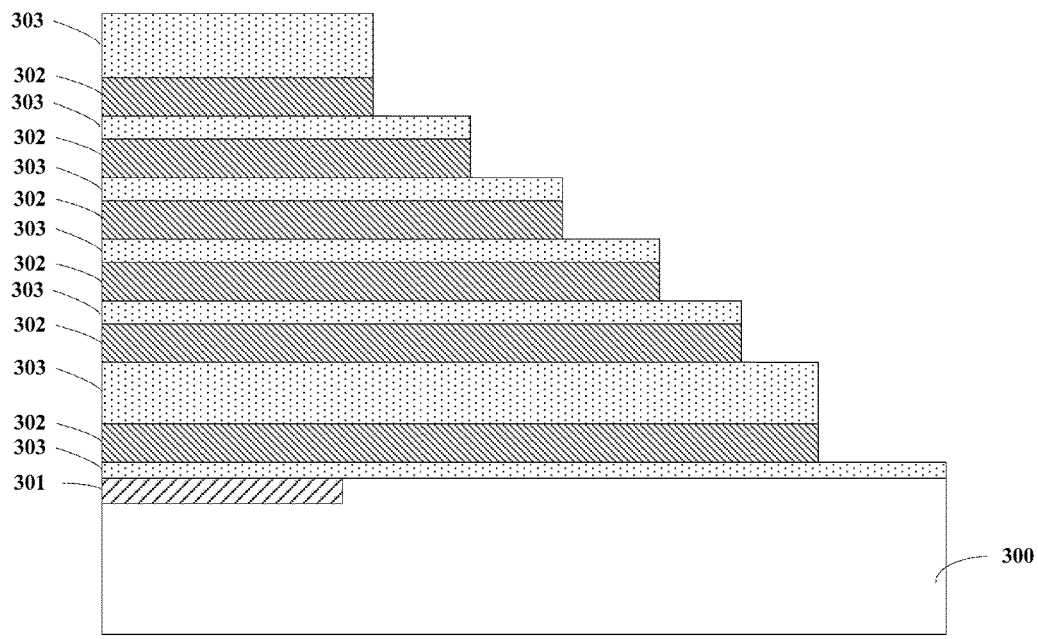
FIG. 3C
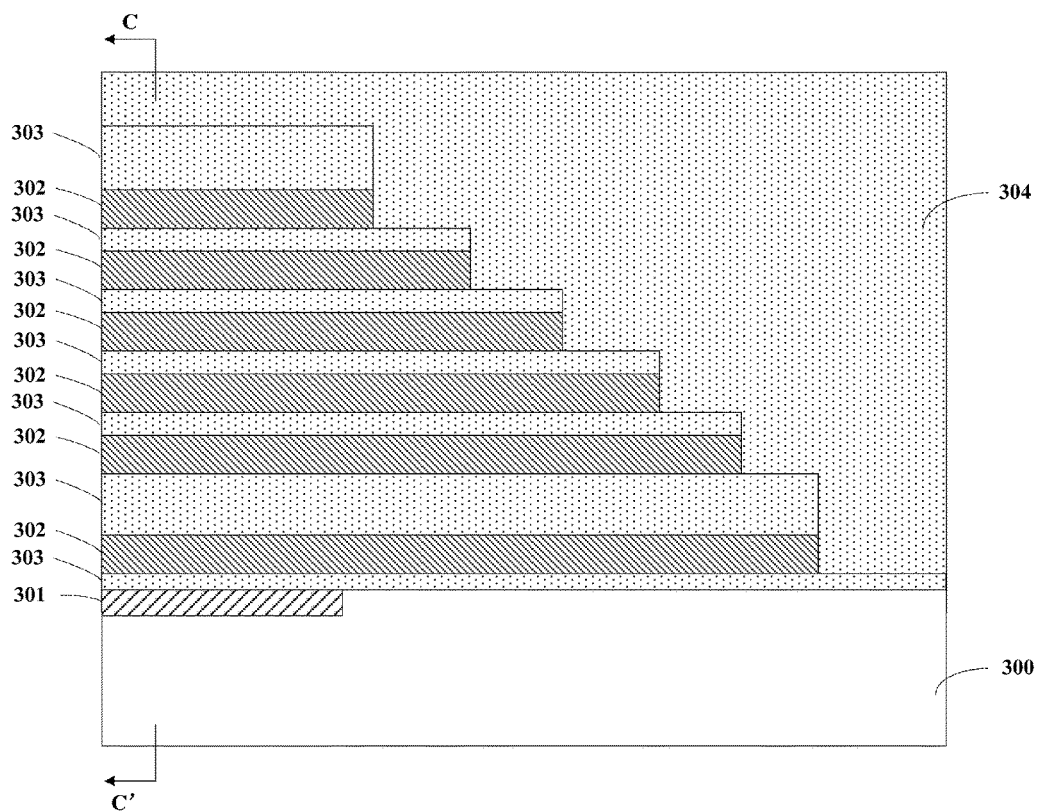
FIG. 3D1

FIG. 3D2

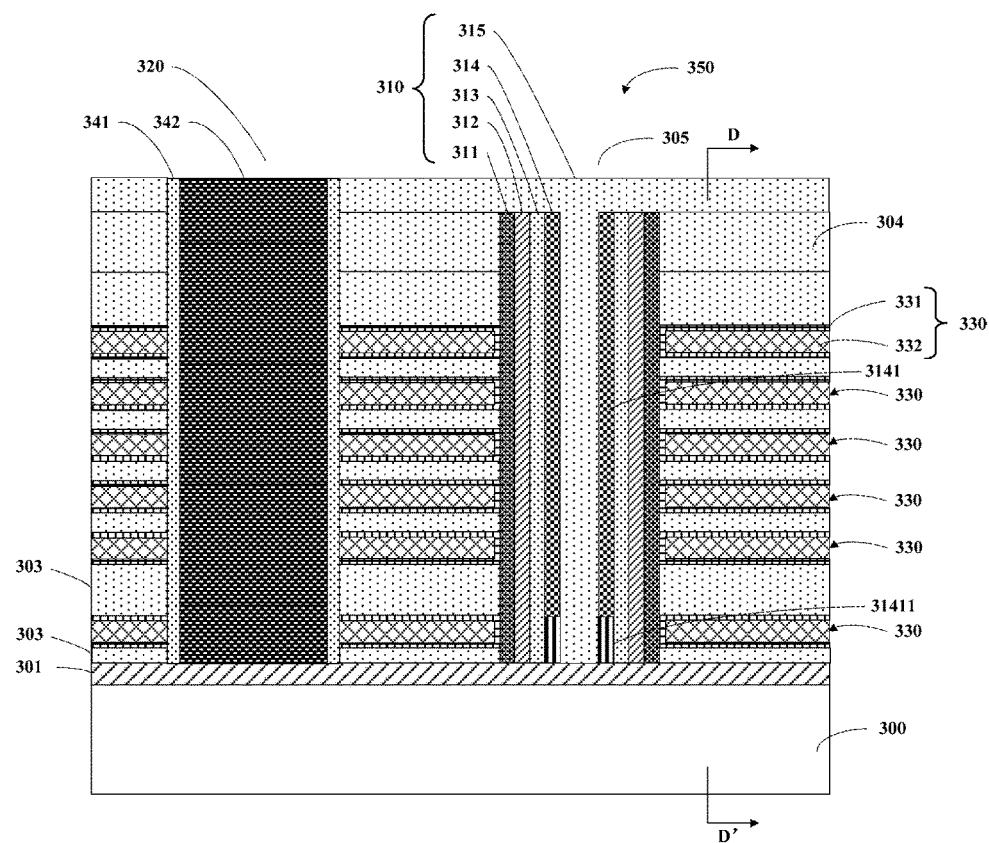
FIG. 3N1
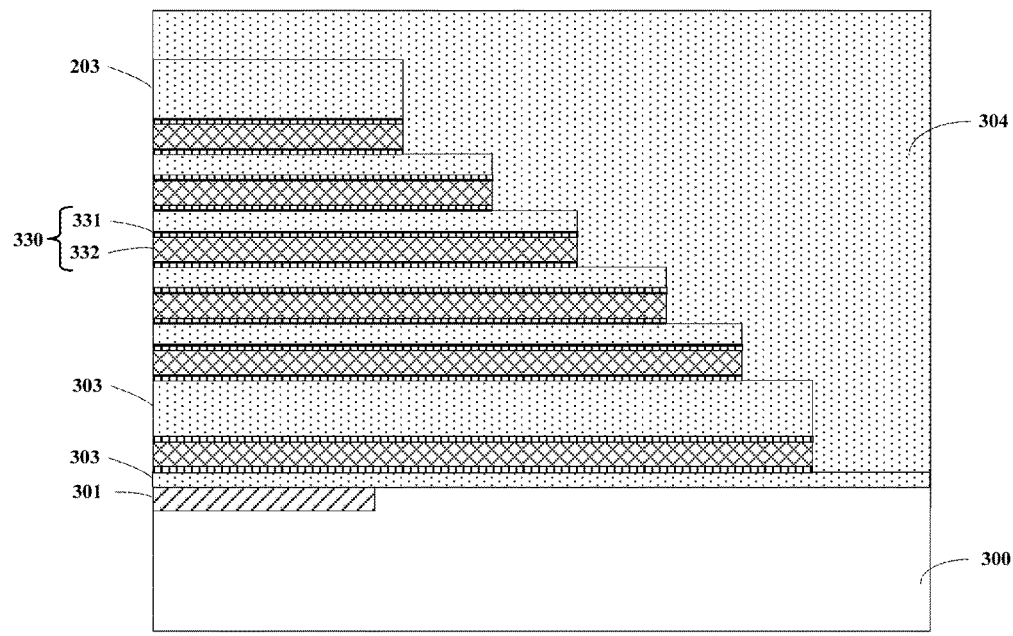
FIG. 3N2

STRUCTURES OF BOTTOM SELECT TRANSISTOR FOR EMBEDDING 3D-NAND IN BEOL AND METHODS

CROSS-REFERENCES TO RELATED APPLICATIONS

The present application claims priority to Chinese patent application No. 201610925895.9, filed with the State Intellectual Property Office of People's Republic of China on Oct. 31, 2016, the content of which is incorporated herein by reference in its entirety.

FIELD OF THE INVENTION

The present invention relates to semiconductor technology, and more particularly to a semiconductor flash memory device and manufacturing method thereof.

BACKGROUND OF THE INVENTION

Recently, three-dimensional NAND flash memory devices are in continuous development. For example, three-dimensional NAND flash memory devices have been fabricated based on terabit cell array transistor (TCAT) technology. These three-dimensional NAND flash memory devices include a plurality of nonvolatile transistors connected in series. Among these transistors, the transistor at the top (referred to as the top transistor) is used as a string select ("SSL") transistor, and the transistor at the bottom (referred to as the bottom transistor) is used as a common source select ("CSS") transistor. Further, a gate select line ("GSL") may turn on the bottom transistor. The bottom transistor includes a portion of the vertical channel and a portion of a horizontal channel on the substrate. The top and bottom selection transistors are simultaneously formed with the formation of other memory cell transistors.

Conventional three-dimensional NAND flash memory devices (e.g., TCAT structures) are manufactured before the back-end-of-line (BEOL) of logic modules. In the manufacturing process of conventional three-dimensional NAND flash memory devices, it is necessary to dope the silicon substrate to form a source or drain of the bottom transistor. Therefore, conventional three-dimensional NAND flash memory devices are directly formed on the silicon substrate. However, a BEOL generally has no silicon substrate, which is typically a dielectric layer (e.g., a metal interlayer dielectric layer). Therefore, conventional three-dimensional NAND flash memory devices are difficult to be form in BEOL processes, that is, conventional three-dimensional NAND flash memory devices are not compatible with the BEOL processing.

BRIEF SUMMARY OF THE INVENTION

The present inventors have discovered these problems and provide novel technical solutions for solving theses problems.

Embodiments of the present invention provide a flash memory device including a substrate, an electrode layer on a portion of the substrate, the electrode layer being a work function adjusting layer or a metal silicide layer, and a memory cell. The memory cell may include a channel structure on the electrode layer and comprising, from an inside to an outside, a channel layer in contact with the electrode layer, a tunneling insulator layer surrounding a surface of the channel layer, a charge trapping layer surrounding a surface of the tunneling insulator layer, and a barrier layer surrounding a surface of the charge trapping layer; and a plurality of gate structures surrounding the channel structure along an axial direction of the channel structure.

In one embodiment, the channel layer includes n-type polysilicon, and the work function adjusting layer includes titanium carbide or titanium-aluminum alloy. Alternatively, the channel layer includes p-type polysilicon, and the work function adjusting layer includes titanium nitride.

In one embodiment, the metal silicide layer includes a nickel-silicon compound. In one embodiment, the electrode layer is a metal silicide layer, and a portion of the channel layer adjacent to the electrode layer is a polysilicon portion having a relatively larger grain size and being surrounded by a gate structure at a bottom of the plurality of gate structures.

In one embodiment, the substrate includes a silicon substrate or a dielectric layer; the tunneling insulator layer includes silicon oxide; the charge trapping layer includes silicon nitride; and the barrier layer includes silicon oxide.

In one embodiment, the electrode layer is embedded in the substrate and has an upper surface flush with an upper surface of the substrate.

In one embodiment, the channel structure further includes a channel core surrounded by the channel layer.

In one embodiment, the memory cell further includes a spacer insulator layer disposed between adjacent gate structures.

In one embodiment, the flash memory device further includes a plurality of memory cells spaced apart from each other, and a metal connecting member disposed between adjacent memory cells and connected to the electrode layer, and a sidewall spacer layer disposed between the metal connecting member and the gate structures.

Embodiments of the present invention also provide a method of manufacturing a flash memory device. The method may include providing a substrate, forming an electrode layer on a portion of the substrate, the electrode layer being a work function adjusting layer or a metal silicide layer, forming a plurality of sacrificial layers alternating with a plurality of spacer insulator layers on the electrode layer, etching the sacrificial layers and the spacer insulator layers to form a through hole exposing a surface of the electrode layer, forming a channel structure in the through hole, removing the sacrificial layers to form a plurality of voids, and forming a plurality of gate structures in the plurality of voids. The channel structure includes, in this order from the inside to the outside, a channel layer in contact with the electrode layer, a tunneling insulator layer surrounding a surface of the channel layer, a charge trapping layer surrounding a surface of the tunneling insulator layer, and a barrier layer surrounding a surface of the charge trapping layer.

In one embodiment, the channel layer includes n-type polysilicon, and the work function adjusting layer includes titanium carbide or titanium-aluminum alloy. Alternatively, the channel layer includes p-type polysilicon, and the work function adjusting layer includes titanium nitride.

In one embodiment, the metal silicide layer includes a nickel-silicon compound.

In one embodiment, forming the channel structure in the through hole includes forming the barrier layer on sidewalls of the through hole, forming the charge trapping layer on the surface of the barrier layer, forming the tunneling insulator layer on the surface of the charge trapping layer, and forming the channel layer on the surface of the tunneling insulator layer and on the bottom of the through hole.

In one embodiment, the channel layer includes a first portion on a surface portion of the tunneling insulator layer and a second portion on a bottom portion of the through hole. The electrode the electrode layer is a metal silicide layer, and the method further includes, after forming the channel layer and prior to removing the plurality of sacrificial layers, subjecting the channel layer to a metal induced lateral crystal (MILC) treatment using the metal silicide layer as a metal inducing layer, such that a grain size of the second portion and a grain size of a portion of the first portion adjacent to the second portion become larger, wherein the portion of the first portion having the larger grain size is surrounded by a sacrificial layer at a bottom of the plurality of sacrificial layers.

In one embodiment, the MILC treatment is performed at a temperature in a range between 200° C. and 400° C.

In one embodiment, forming the channel structure in the through hole further includes, after forming the channel layer, forming a channel core filling the through hole.

In one embodiment, the electrode layer is embedded in the substrate and has an upper surface flush with an upper surface of the substrate.

In one embodiment, the method further includes, after forming the channel structure and prior to removing the plurality of sacrificial layers, etching the sacrificial layers and the spacer insulation layers to form a trench exposing the electrode layer. The method also includes, after forming the plurality of gate structures, forming a sidewall spacer layer on sidewalls of the trench, and forming a metal connecting member in the trench connected to the electrode layer.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

FIGS. 2A-2B, 2C1-2C2, 2D-2K, 2L1-2L2 and 2M are cross-sectional views illustrating intermediate stages of a semiconductor flash memory device in some of the main steps in a manufacturing method according to some embodiments of the present invention.

FIGS. 3A-3C, 3D1-3D2, 3E-3M, 3N1-3N2 and 3O are cross-sectional views illustrating intermediate stages of a semiconductor flash memory device in some of the main steps in a manufacturing method according to further embodiments of the present invention.

DETAILED DESCRIPTION OF THE INVENTION

Figure 1:
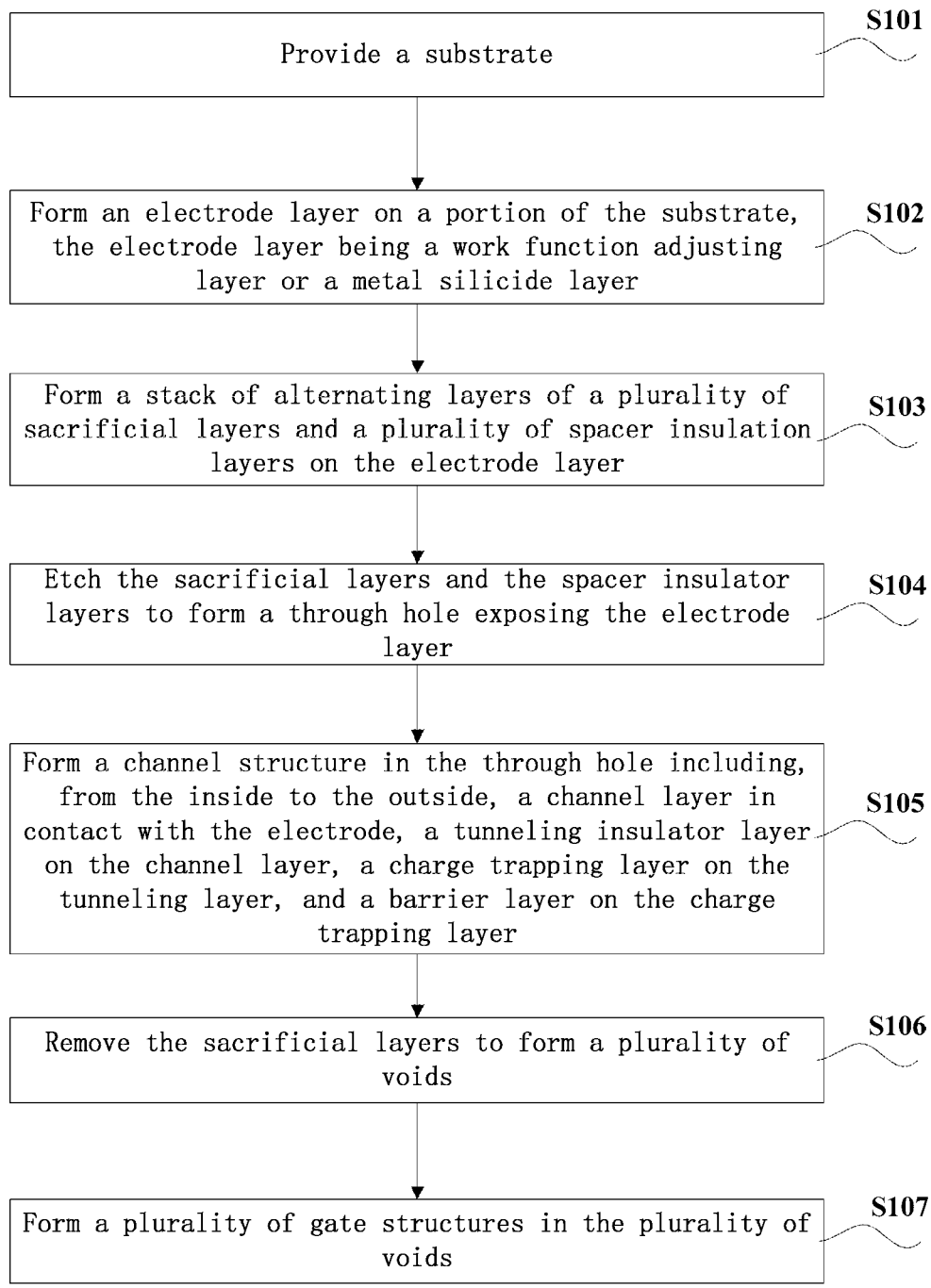
FIG. 1 is a simplified flowchart illustrating some of the main steps in a method for manufacturing a semiconductor flash memory device according to one embodiment of the present invention

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast., when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise, It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIG. 1 is a simplified flowchart of a method for manufacturing a semiconductor flash memory device according to one embodiment of the present invention. The method may include the following steps:

S101: providing a substrate including a semiconductor substrate or a dielectric layer.

S102: forming an electrode layer on a portion of the substrate. The electrode layer may be a work function adjusting layer or a metal silicide layer. For example, the electrode layer may be embedded in the substrate and has an upper surface substantially flush with an upper surface of the substrate. As used herein, the term "substantially flush" means that the upper surface of the electrode layer and the upper surface of the substrate are flush (coplanar) within a certain allowable tolerance range as long as subsequent steps of the present invention can be performed.

The work function adjusting layer may include titanium carbide, titanium aluminum alloy, titanium nitride, or the like. The metal silicide layer may include a Ni silicide or the like.

S103: forming a stack of a plurality of sacrificial layers and a plurality of spacer insulator layers alternatingly disposed on the electrode layer.

S104: etching the sacrificial layers and the spacer insulator layers to form a through hole exposed a surface portion of the electrode layer.

S105: forming a channel structure in the through hole. The channel structure may include, in this order from the inside to the outside, a channel layer in contact with the electrode layer, a tunneling insulator layer surrounding the surface of the channel layer, a charge trapping layer surrounding the surface of the tunneling insulator layer, and a barrier layer surrounding the surface of the charge trapping layer. The channel layer may include a semiconductor material (e.g., polysilicon). The tunneling insulator layer may include silicon oxide. The charge trapping layer may include silicon nitride. The barrier layer may include silicon oxide. Of course, those skilled in the art will appreciate that the material of each layer of the above-described channel structure is merely exemplary, and that the scope of the invention is not limited thereto.

In one embodiment, S105 may include forming a barrier layer on the side surface of the through hole, forming a charge trapping layer on the side surface of the barrier layer, and forming a channel layer on the side surface of the tunneling insulator layer and the bottom of the through hole. For example, the channel layer may include a first portion on the side surface of the tunneling insulator layer and a second portion on the bottom of the through hole. In one embodiment, S105 may further include removing the second portion of the channel layer.

In one embodiment, the channel structure may further include a channel core surrounded by the channel layer. The channel core may include silicon oxide. In one embodiment, after forming the channel layer, S105 may also include forming the channel core that fills the through hole.

S106: removing the plurality of sacrificial layers to form a plurality of voids.

S107: forming a plurality of gate structures in the voids. For example, a gate structure is formed in each void.

In the above-described manufacturing method of the embodiment, an electrode layer is formed in the substrate. The electrode layer may be a work function adjusting layer or a metal silicide layer, and the electrode layer is configured to be a source or a drain of a subsequent formed bottom transistor of a flash memory device. Compared with the prior art flash memory device (where the substrate needs to be doped to form a source or a drain), the flash memory device manufactured by the method of the embodiment of the present invention can be formed not only on a silicon substrate, but also on a non-silicon substrate, for example, on a dielectric layer, so that the manufacturing method is compatible with the BEOL process.

In some embodiments, the manufacturing method of the embodiment of the present invention may be performed after the front end-of-line (BEOL), for example, after forming contacts and metal layers for a logic circuit. Of course, the scope of the present invention is not limited thereto.

In some embodiments, the channel layer may include n-type polysilicon, and the work function adjusting layer may include titanium carbide (TiC) or a titanium aluminum (TiAl) alloy. In other embodiments, the channel layer may include p-type polysilicon, and the work function adjusting layer may include titanium nitride (TiN).

In one embodiment, in the case where the electrode layer is a metal silicide layer, the manufacturing method may further include performing a metal induced lateral crystallization (MILC) on the channel layer using the metal silicide layer as a metal inducing layer after forming the channel layer and before removing the sacrificial layers. For example, the MILC treatment is performed at a temperature of 200° C. to 400° C. so that the grain size of the second portion of the channel layer and the grain size of a portion of the first portion adjacent to the second portion become larger. The portion of the first portion having the larger grain size is surrounded by the at most bottom sacrificial layer of the plurality of sacrificial layers. After forming the plurality of gate structures, the portion of the first portion will be surrounded by the at most bottom gate structure of the plurality of gate structures. A channel layer having a larger grain size can be obtained by the MILC treatment, and the bottom transistor including the channel layer with the larger grain size (the bottom transistor may be a thin film transistor (TFT)) that operates as the switch for the memory cell can better control the leakage current. In addition, since the portion of the channel layer with the larger grain size can be formed only in the bottom region, it won't have a large effect on the total current of the flash memory device during operation.

In one embodiment, the manufacturing method may further include etching the sacrificial layers and the spacer insulator layers to form a trench exposing a surface of the electrode layer after forming the channel structure and prior to removing the sacrificial layers. In one embodiment, after forming the plurality of gate structures, the manufacturing method may also include forming a sidewall spacer on sidewalls of the trench; and forming a metal connecting member in the trench connected to the electrode layer after forming the sidewall spacer.

FIGS. 2A-2B, 2C1-2C2, 2D-2K, 2L1-2L2 and 2M are cross-sectional views illustrating intermediate stages of a semiconductor flash memory device in some of the main steps in a manufacturing method according to some embodiments of the present invention. A manufacturing process of a flash memory device according to an embodiment of the present invention will be described in detail with reference to these Figures.

Figure 2A:
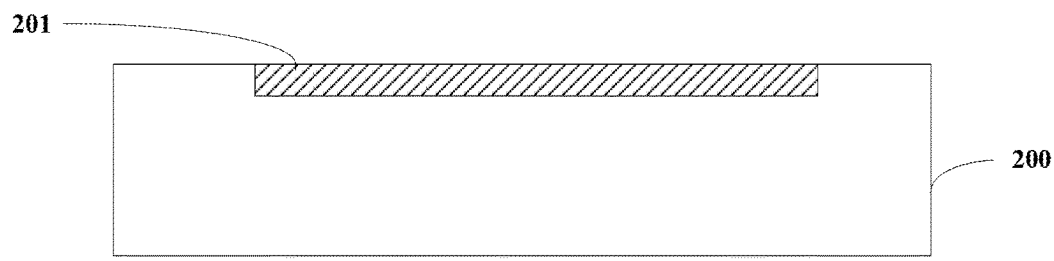

First, referring to FIG. 2A, a substrate 200 is provided. Substrate 200 may include a silicon substrate or a dielectric layer (e.g., a silicon oxide). As shown in FIG. 2A, an electrode layer 201 is formed on a portion of substrate 200. For example, electrode layer 201 may be embedded in substrate 200 and has an upper surface substantially flush with an upper surface of substrate 200. For example, electrode layer 201 may be a work function adjusting layer including, e.g., titanium carbide.

In one embodiment, forming electrode layer 201 may include forming a recess in substrate 200 using a photolithography and etching process, and forming a work function adjusting layer filling the recess using a physical vapor deposition process, and then performing a planarization (e.g., chemical mechanical polishing) process on the work function adjusting layer to obtain the structure shown in FIG. 2A.

Figure 2B:
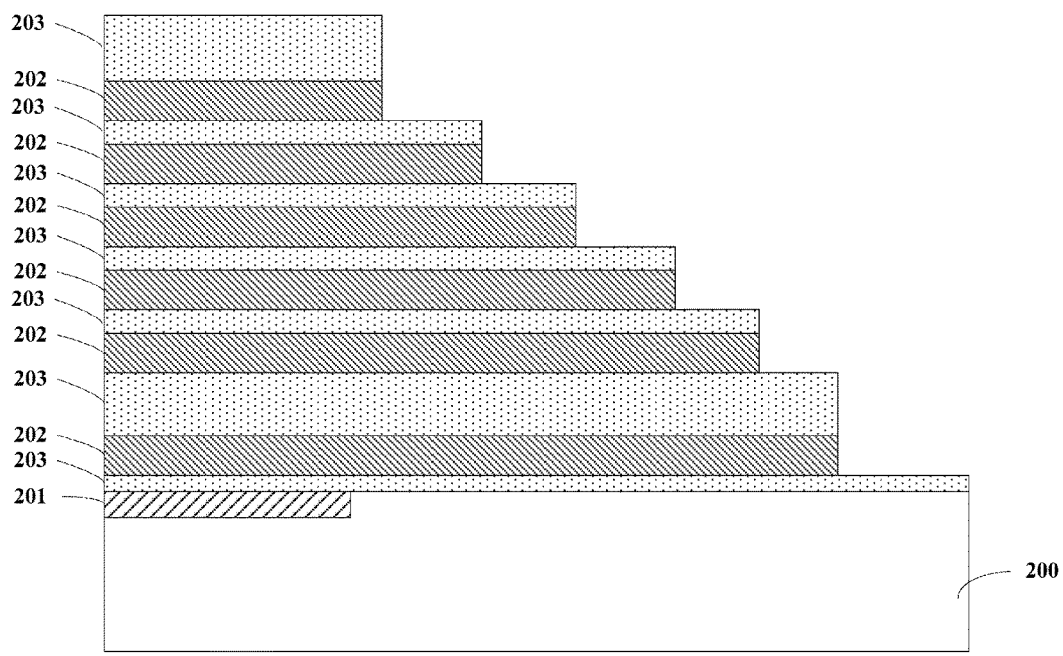

Next, referring to FIG. 2B, a plurality of sacrificial layers 202 and a plurality of spacer insulator layers 203 are alternately formed on electrode layer 201, e.g., using a deposition process; and an etching process is performed on sacrificial layers 202 and spacer insulator layers 203 to obtain a step-shaped structure. For example, the sacrificial layers may include silicon nitride, and the spacer insulator layers may include silicon dioxide. In one embodiment, in the multilayer stack of alternate sacrificial layers 202 and spacer insulator layers 203, a layer of the spacer insulator layers is disposed at the bottom, that is, during the formation of the multilayer stack, a first spacer insulator layer is first formed on the electrode layer and on the substrate, then a first sacrificial layer is formed on the first spacer insulator layer, then a second spacer insulator layer is formed on the first sacrificial layer, and so on. In one embodiment, the thickness of the spacer insulator layer at the bottom is less than the thickness of the sacrificial layers, i.e., the spacer insulator layer at the bottom is a relatively thin layer with respect to other layers.

It is to be noted that, for the sake of convenience of description, FIG. 2B is a simplified schematic diagram showing only a partial structure of a flash memory device (so are the figures that follow). For example, a portion of the above-described step-shaped multilayer stack is shown, and the scope of the present invention is not limited thereto.

Next, referring to FIGS. 2C1 and 2C2, an interlayer dielectric layer 204 is formed (e.g., using a deposition process) on the step-shaped structure formed by the alternating layers of sacrificial layers and spacer insulator layers. Interlayer dielectric layer 204 may include silicon dioxide. It is noted that FIG. 2C2 is a cross-sectional view of the structure in FIG. 2C1 taken along the line A-A'.

Figure 2D:
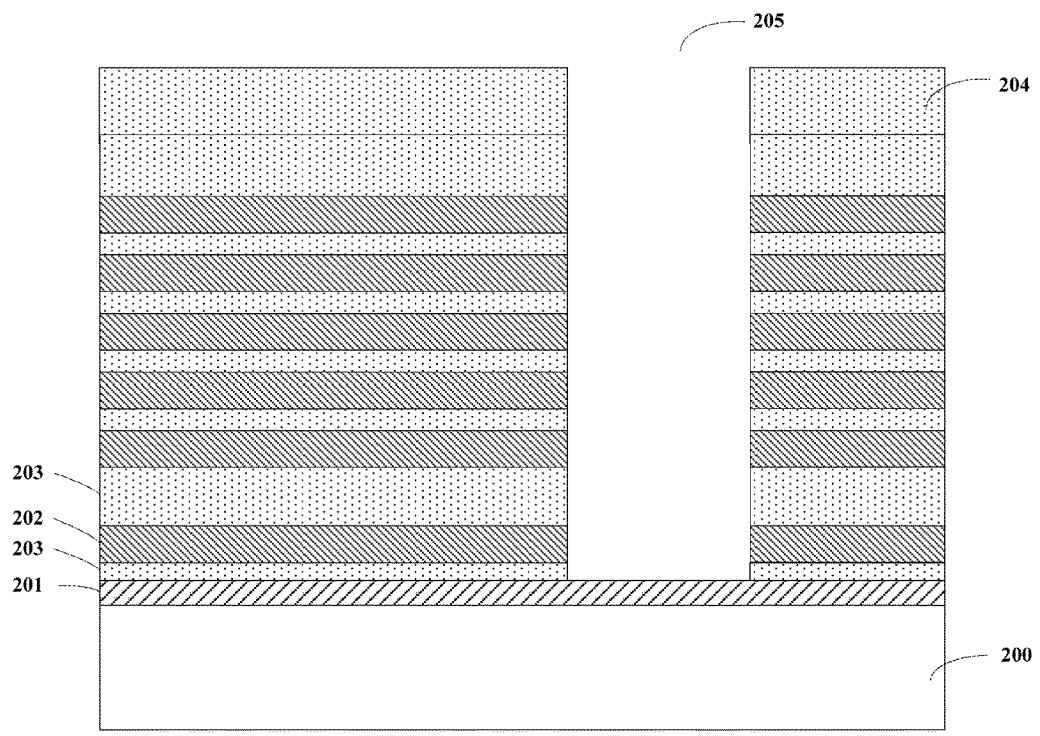

Next, referring to FIG. 2D, sacrificial layer 202 and spacer insulator layers 203 are etched to form a though hole 205 that exposes a surface of the electrode layer 201.

Figure 2E:
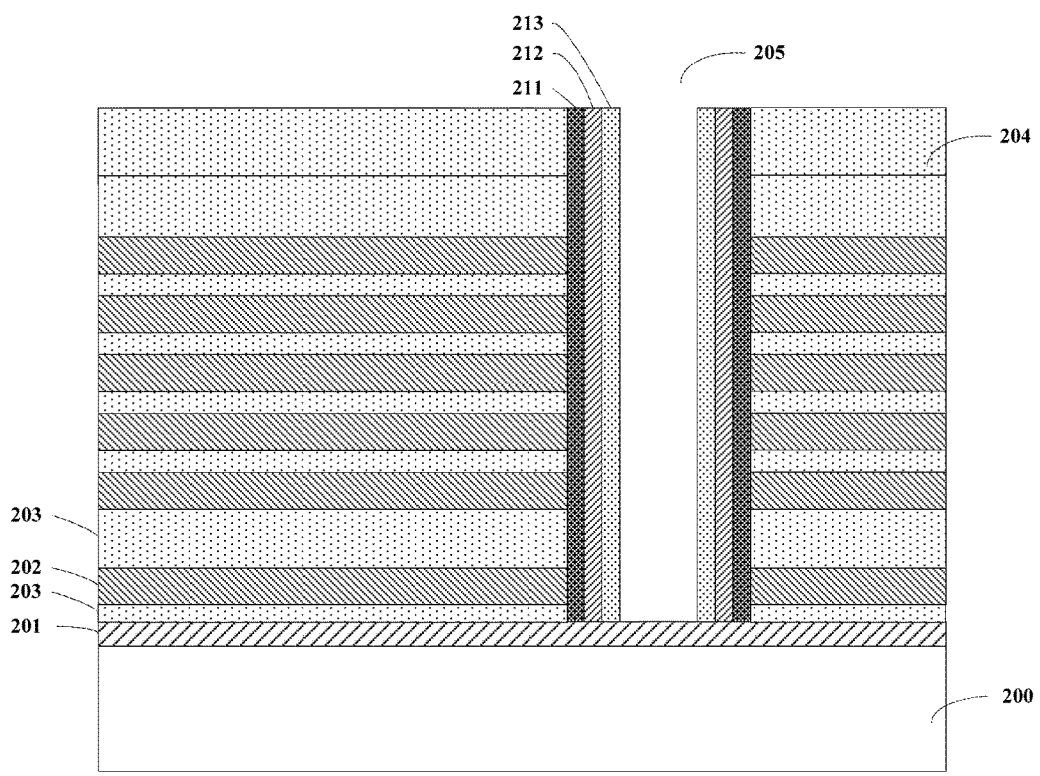

Next, in one embodiment, referring to FIG. 2E, a barrier layer 211 is formed on sidewalls of through hole 205, e.g., using an atomic layer deposition (ALD) process, a charge trapping layer 212 is then formed (e.g., using an ALD process) on the side surface of barrier layer 211, and a tunneling insulator layer 213 is then formed (e.g., using an ALD process) on the side surface of charge trapping layer 212. In another embodiment, the barrier layer, the charge trapping layer, and the tunneling insulator layer may be sequentially deposited on the bottom and sidewalls of through hole 205, and thereafter, the barrier layer, the charge trapping layer, and the tunneling insulator layer may be etched back to expose the surface of electrode layer 201 at the bottom of the through hole. In one embodiment, the barrier layer may include silicon oxide, the charge trapping layer may include silicon nitride, and the tunneling insulator layer may include silicon oxide, so that these three layers form an ONO (oxide-silicon nitride-oxide) structure.

Figure 2F:
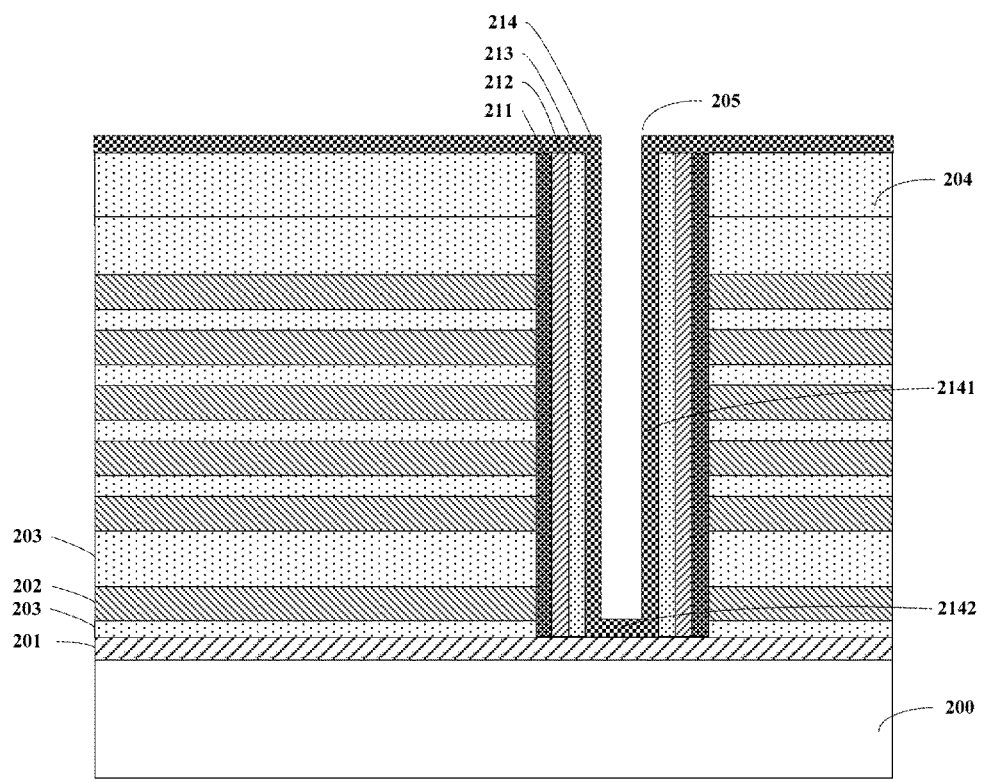

Next, referring to FIG. 2F, a channel layer 214 is formed on the side surface of tunneling insulator layer 213 and at the bottom of through hole 205, e.g., using a low-temperature deposition process. The low-temperature deposition process may be in the range between 350° C. and 400° C., e.g., 380° C. The channel layer may be an n-type polysilicon layer. As shown in FIG. 2F, channel layer 214 may include a first portion 2141 on the side surface of tunneling insulator layer 213 and a second portion 2142 on the bottom of the through hole.

Figure 2G:
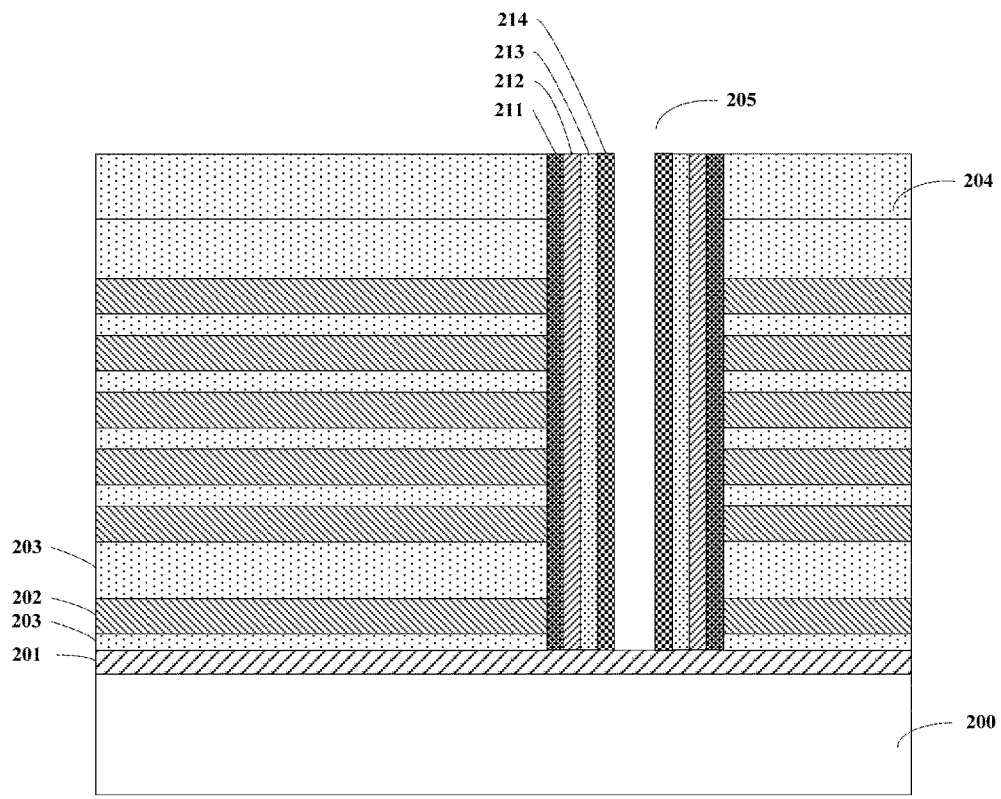

Next, referring to FIG. 2G, a portion of channel layer 214 over interlayer dielectric layer 204 is removed. In one embodiment, second portion 2142 of channel layer 214 may also be removed.

Figure 2H:
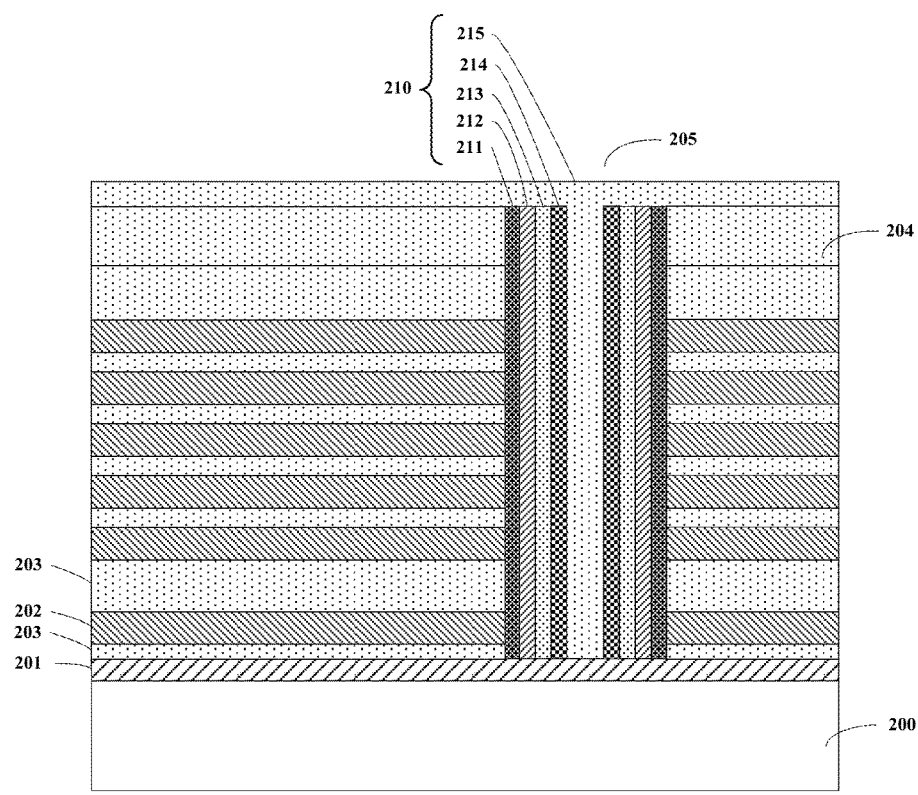

Next, referring to FIG. 2H, a channel core 215 is formed to fill through hole 205, e.g., using a deposition process. In one embodiment, a planarization process is performed on the channel core. In one embodiment, a portion of the channel core over the interlayer dielectric layer 204 may also be removed. Thus, a channel structure 210 according to one embodiment is formed. Channel structure 210 may include a barrier layer 211, a charge trapping layer 212, a tunneling insulator layer 213, a channel layer 214, and a channel core 215.

Figure 2I:
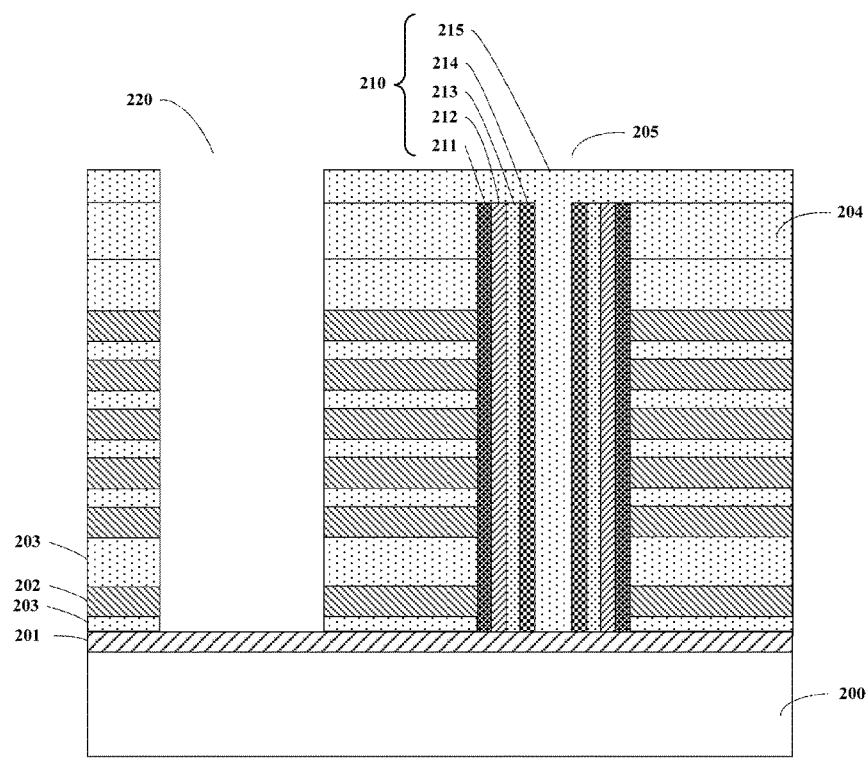

Next, referring to FIG. 2I, sacrificial layers 202 and spacer insulator layers 203 are etched to form a trench 220. The trench may be used to segment the stack of alternate sacrificial layers 202 and spacer insulator layers 203 into different separate portions to form a plurality of vertical strings of memory cells, each of the strings of memory cells includes the above-described channel structure.

Figure 2J:
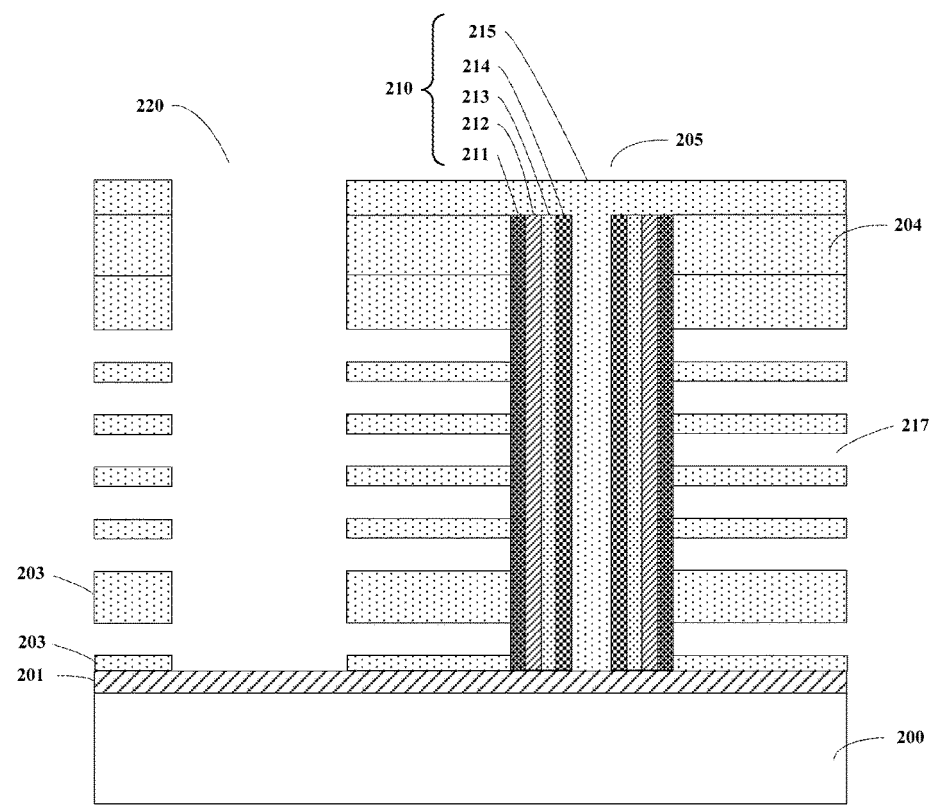

Next, referring to FIG. 2J, sacrificial layers 202 are removed, e.g., using an etching process, to form a plurality of voids 217.

Figure 2K:
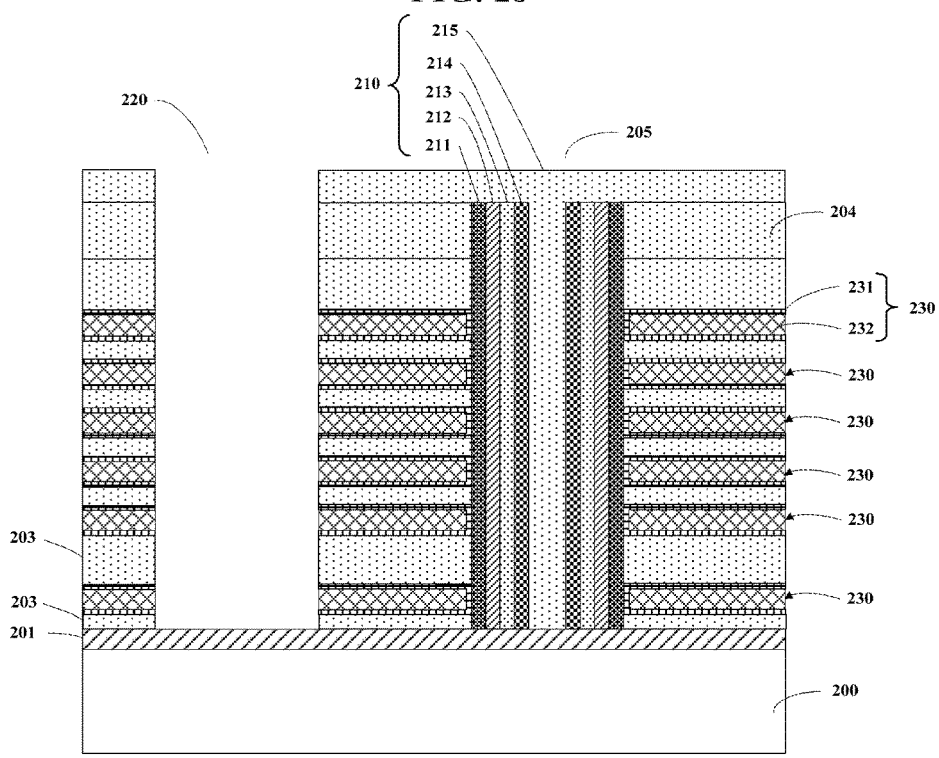

Next, referring to FIG. 2K, a plurality of gate structures 230 are formed in voids 217. Gate structures 230 each may include a gate 232 that surrounds the channel structure and a gate work function adjusting layer 231 on the surface of gates 232. A portion (i.e., the vertical portion) of gate work function adjusting layer 231 is disposed between the gate and the channel structure. The gate may include a metal such as tungsten. The gate work function adjusting layer may include titanium nitride or titanium carbide. In some embodiments, in the process of forming the gate structure, a portion of the gate structure (e.g., a portion of the gate work function adjusting layer and a portion of the gate) may be formed in trench 220, so that the manufacturing method of the embodiment may include removing the portion of the gate structure in the trench using, e.g., an etching process.

Next, referring to FIG. 2L1, a sidewall spacer layer 241 is formed on the sidewalls of trench 220. Forming the sidewall spacer layer may include forming a sidewall spacer layer on the bottom and sidewalls of the trench using, e.g., a deposition process, and then removing the portion of the sidewall spacer layer on the bottom of the trench using a back etch process. For example, the sidewall spacer layer may include silicon dioxide. After forming sidewall spacer layer 241, a metal connecting member 242 is formed in trench 220 connecting to electrode layer 201 by a chemical vapor deposition (CVD) process, as shown in FIG. 2L1. The metal connecting member may include a metal such as tungsten. In one embodiment, a planarization process may be performed on the metal connecting member. FIG. 2L2 is a schematic cross-sectional view of the structure shown in FIG. 2L1 taken along the line B-B'. It should be noted that, in some embodiments, since the step of removing a portion of channel core 215 on interlayer dielectric layer 204 may be included in the preceding steps, the portion of channel core 215 on the on interlayer dielectric layer may not be shown in FIG. 2L2.

Figure 2M:
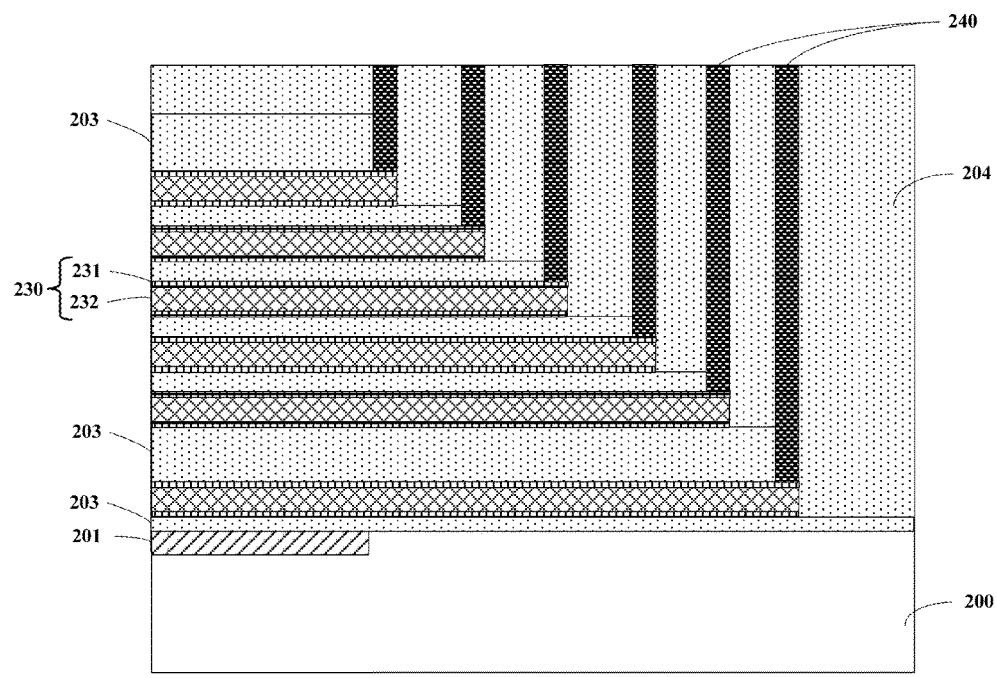

Next, referring to FIG. 2M, a plurality of gate contacts 240 are formed, each of the gate contacts is connected to one of gate structures 230. For example, interlayer dielectric layer 204 is etched (e.g., using a photolithography and etching process) to form an opening exposing gate structures 230, and then gate contacts are formed in the opening using, e.g., a deposition process. For example, the gate contacts may include a work function adjusting layer (e.g., titanium nitride, titanium carbide) on the sidewalls and bottom of the opening and a meal layer (e.g., tungsten) on the work function adjusting layer.

Thus, a method of manufacturing a flash memory device according to one embodiment of the present invention is provided. In the manufacturing process of the flash memory device, the work function adjusting layer is used as the electrode layer to form the source or the drain of the bottom transistor, the manufacturing process may be performed at a low process temperature of lower than 400° C. The flash memory device according to the manufacturing method can be formed after a logic circuit has been formed, and therefore, the process has a good compatibility with the back-end-of-line process. The above-described method of manufacturing nonvolatile memory devices can be compatible with BEOL of the logic circuit. The method enables a significant improvement in the degree of integration of nonvolatile memory devices with regard to conventional process techniques.

In some embodiments, the method may further include forming channel contacts in contact with the channel layer, and word line connected to the channel contacts. The channel contacts and the word lines may be formed using conventional process techniques and will not be described herein for the sake of brevity.

Embodiments of the present invention also provide a flash memory device. Referring to FIG. 2L1, the flash memory device may include a substrate 200, and an electrode layer 201 on a portion of a substrate 200. Substrate 200 may include a silicon substrate or a dielectric layer. Electrode layer 201 may be a work function adjusting layer. In one embodiment, electrode layer 201 is embedded in substrate 200 and has an upper surface substantially flush with the upper surface of substrate 200 (not shown in FIG. 2L1, please see the positional relationship between the electrode layer and the substrate in FIG. 2A).

The flash memory device also includes a memory cell 250. As used herein, "a memory cell" refers to a component of a memory device. Non-limiting examples of memory devices include flash memory devices (e.g., a NAND flash memory device). The memory cell of the invention may be a structure portion of a three-dimensional memory device, e.g., a string of memory cells having a SSL gate at the top (the top gate structure) and a GSL gate at the bottom (the bottom gate structure).

Referring to FIG. 2L1, memory cell 250 may include a channel structure 210 on electrode layer 201. Channel structure 210 may include, in this order from the inside to the outside, a channel layer 214 in contact with electrode layer 201, a tunneling insulator layer 213 surrounding the surface of channel layer 214, a charge trapping layer 212 surrounding the surface of tunneling insulator layer 213, and a barrier layer 211 surrounding the surface of charge trapping layer 212. Channel layer 214 may include a semiconductor material (e.g., polysilicon). In one embodiment, channel layer 214 may include n-type polysilicon, and work function adjusting layer 201 may include titanium carbide or titanium-aluminum alloy. In another embodiment, channel layer 214 may include p-type polysilicon, and work function adjusting layer 201 may include titanium nitride. Tunneling insulator layer 213 may include silicon oxide. Charge trapping layer 212 may include silicon nitride. Barrier layer 211 may include silicon oxide.

In some embodiments, the charge trapping layer may completely surrounds the tunneling insulator layer or partially surrounds the tunneling insulator layer.

In one embodiment, the channel structure may further include a channel core 215 surrounded by channel layer 214. Channel core 215 may include silicon dioxide.

Referring still to FIG. 2L1, memory cell 250 may further include a plurality of gate structures 230 surrounding the channel structure along the axial direction of channel structure 210. In one embodiment, gate structures 230 each may include a gate 232 that surrounds the channel structure and a gate work function adjusting layer 231 on the surface of gate 232. A portion of gate work function adjusting layer 231 is disposed between the gate and the channel structure. Gates may include a metal such as tungsten. The gate work function adjusting layer may include titanium nitride or titanium carbide. As used herein, the term "axial direction" refers to the direction along which the channel structure extends, that is, the flow of current flowing through the channel layer when the flash memory device is operating. In the example shown in FIG. 2L1, the axial direction of the channel structure is perpendicular to the upper surface of the substrate. Electrode layer 201 is a work function adjusting layer configured to be a common source for the bottom select transistors of the memory device. Thus, the bottom select transistor is a TFT having a metal source, a polysilicon drain and a polysilicon channel. The bottom gate structure is the gate select line (GSL) of the bottom select transistor. The work function adjusting layer to the polysilicon channel is a Schottky diode, the GSL can control the Schottky diode to turn it on or off through the polysilicon channel forming an inversion layer, the work function metal (e.g., TiC) to this inversion layer is an ohmic contact.

In one embodiment, memory cell 250 may also include a spacer insulator layer 203 disposed between adjacent gate structures. Spacer insulator layer 203 may include silicon dioxide.

In one embodiment, the gate structures and the spacer insulator layers may form a step shape (e.g., shown in FIG. 2M). The flash memory cell may also include gate contacts 240 connected to the gate structures. The flash memory device may also include an interlayer dielectric layer 204 surrounding gate contacts 240.

In one embodiment, the flash memory device may include a plurality of memory cells 250 spaced apart from each other. For example, the flash memory device may include four or eight memory cells, this configuration facilitates the compatibility of the flash memory device and the dielectric layer between the metal layers in the back-end of line process of the logic circuit. The flash memory device may further include a metal connecting member 242 disposed between adjacent memory cells and connected to electrode layer 201, and a sidewall spacer layer 241 separating metal connecting member 242 from gate structures 230 as shown in FIG. 2L1. Metal connecting member 242 may include a metal such as tungsten. Sidewall spacer layer 241 may include silicon dioxide.

In the flash memory device shown in FIG, 2L1, the electrode layer is a work function adjusting layer, a Schottky contact exists between the work function adjusting layer and the channel layer, and the leakage current control in the channel layer is achieved by controlling the gate of the Schottky junction switch, where a voltage is applied to the gate of the bottom transistor so that the bottom of the channel layer forms an inversion layer, and the Schottky contact becomes an ohmic contact.

According to the above-described embodiment, the flash memory device has an electrode layer used as the source or drain of the bottom transistor, the flash memory device can be formed on the dielectric layer and thus has good compatibility with the back-end-of-line process.

FIGS. 3A-3C, 3D1-3D2, 3E-3M, 3N1-3N2 and 3O are cross-sectional views illustrating intermediate stages of a semiconductor flash memory device in some of the main steps in a manufacturing method according to another embodiment of the present invention. A manufacturing method of a flash memory according to one embodiment of the present invention will be described in detail below with reference to these figures.

Figure 3A:
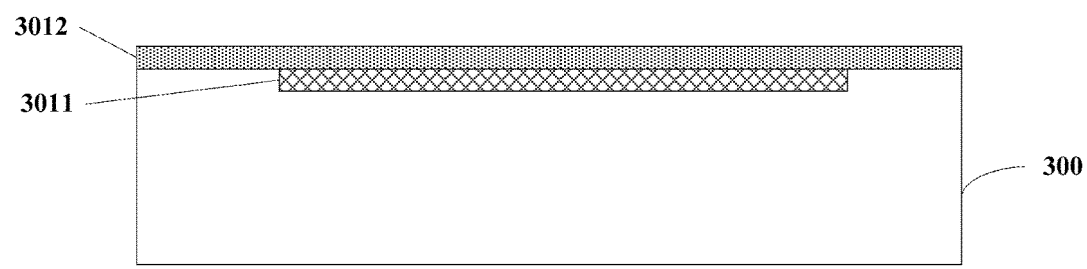

Referring to FIG. 3A, a substrate 300 is provided. Substrate 300 may be a silicon substrate or a dielectric layer (e.g., a silicon oxide layer).

Figure 3B:
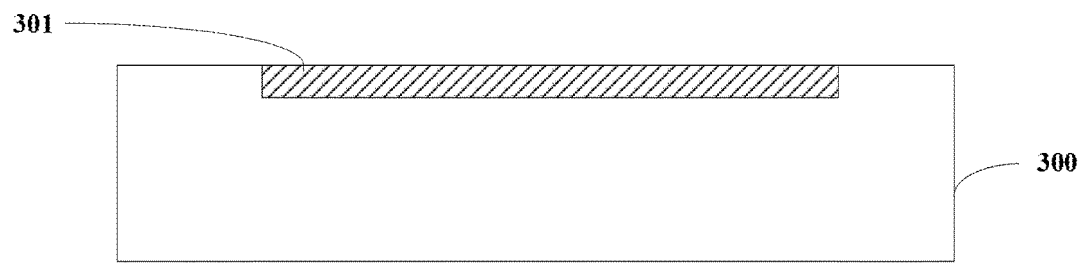

Then, referring to FIG. 3B, an electrode layer 301 is formed on a portion of substrate 300. For example, electrode layer 301 is embedded in substrate 300 and has an upper surface substantially flush with an upper surface of substrate 300. For example, electrode layer 301 may be a metal silicide layer including, e.g., a nickel-silicon compound.

In one embodiment, forming electrode layer 301 may include forming a recess in substrate 300 using a photolithography and etching process, and depositing an amorphous silicon layer 3011 in the recess, and forming a metal layer (e.g., a nickel layer) 3012 on amorphous silicon layer 3011 using, e.g., a PVD process,. Next, amorphous silicon layer 3011 and metal layer 3012 form into a metal silicide layer (e.g., nickel-silicon compound) as electrode layer 301, as shown in FIG. 3B. In one embodiment, after forming the metal silicide layer, the method may further include removing excess of the metal layer.

Next, referring to FIG. 3C, a plurality of sacrificial layers 302 and a plurality of spacer insulator layers 303 are alternately formed on electrode layer 301, e.g., using a deposition process; and an etching process is performed on sacrificial layers 302 and spacer insulator layers 303 to obtain a step-shaped structure. For example, the sacrificial layers may include silicon nitride, and the spacer insulator layers may include silicon dioxide. In one embodiment, in the multilayer stack of alternate layers of sacrificial layers 302 and spacer insulator layers 303, a layer of the spacer insulator layers is disposed at the bottom, that is, during the formation of the multilayer stack, a first spacer insulator layer is first formed on the electrode layer and on the substrate, then a first sacrificial layer is formed on the first spacer insulator layer, then a second spacer insulator layer is on the first sacrificial layer, and so on. In one embodiment, the thickness of the spacer insulator layer at the bottom is less than the thickness of any of the sacrificial layers, i.e., the spacer insulator layer at the bottom is a relatively thin layer with respect to other layers.

It is to be noted that, for the sake of convenience of description, FIG. 3C is a simplified schematic diagram showing only a partial structure of a flash memory device (so are the following figures). For example, a portion of the electrode layer and a portion of the above-described step-shaped multilayer stack are shown, and the scope of the present invention is not limited thereto.

Next, referring to FIGS. 3D1 and 3D2, an interlayer dielectric layer 304 is formed (e.g., using a deposition process) on the step-shaped structure formed by the sacrificial layers and the spacer insulator layers. Interlayer dielectric layer 304 may include silicon dioxide. It is noted that FIG. 3D2 is a cross-sectional view of the structure in FIG. 3D1 taken along the line C-C'.

Figure 3E:
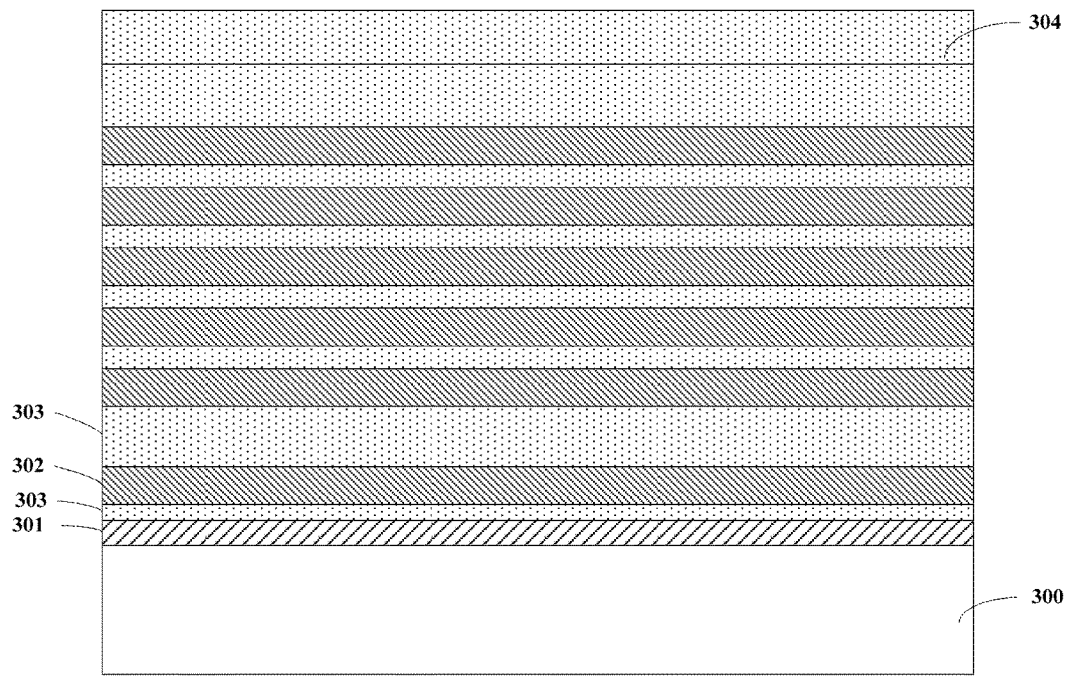
Figure 3E:
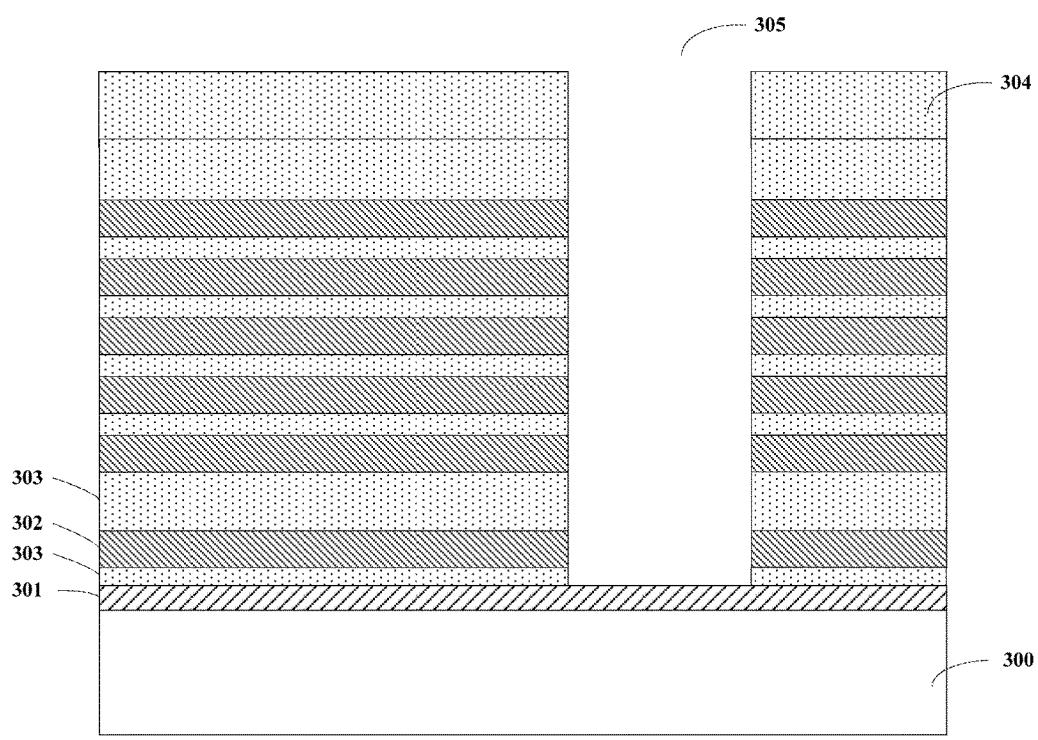

Next, referring to FIG. 3E, sacrificial layers 302 and spacer insulator layers 303 are etched to form a though hole 305 that exposes a surface of the electrode layer 301.

Figure 3F:
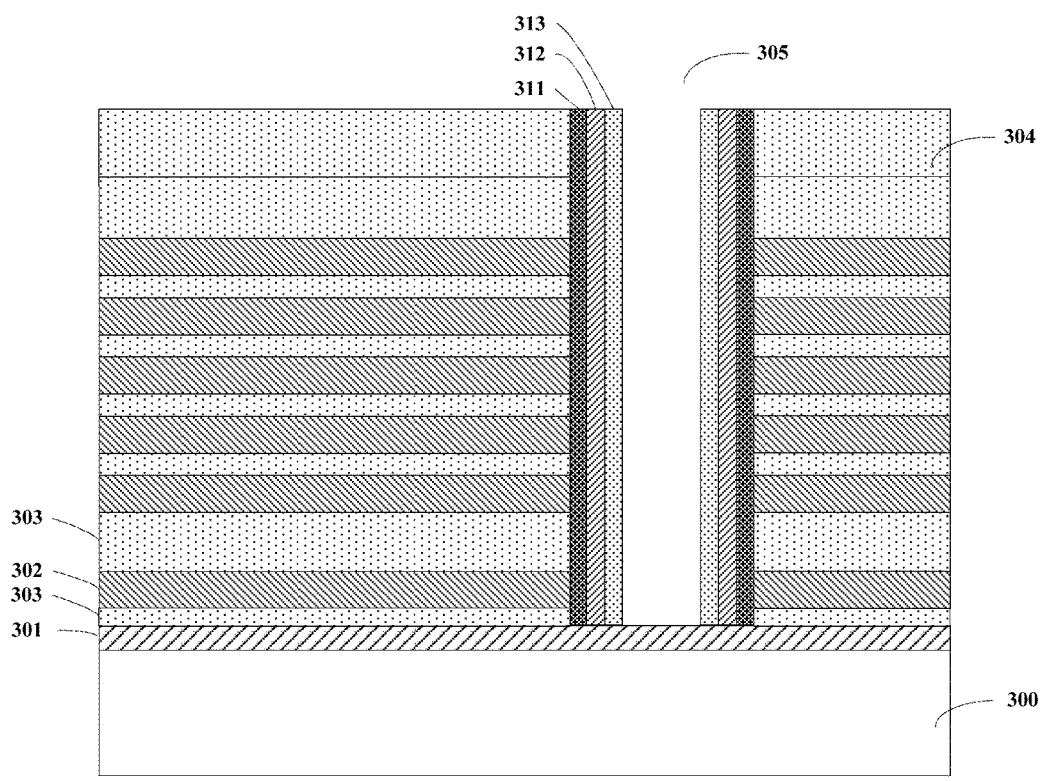

Next, in one embodiment, referring to FIG. 3F, a barrier layer 311 is formed on sidewalls of through hole 305, e.g., using an atomic layer deposition (ALD) process, a charge trapping layer 312 is then formed (e.g., using an ALD process) on the side surface of barrier layer 311, and a tunneling insulator layer 313 is then formed (e.g., using an ALD process) on the side surface of charge trapping layer 312. In another embodiment, the barrier layer, the charge trapping layer, and the tunneling insulator layer may be sequentially deposited on the bottom and sidewalls of through hole 305, and thereafter, the barrier layer, the charge trapping layer, and the tunneling insulator layer may be etched back to expose the surface of electrode layer 301 at the bottom of the through hole. In one embodiment, the barrier layer may include silicon oxide, the charge trapping layer may include silicon nitride, and the tunneling insulator layer may include silicon oxide, so that these three layers form an ONO (oxide-silicon nitride-oxide) structure.

Figure 3G:
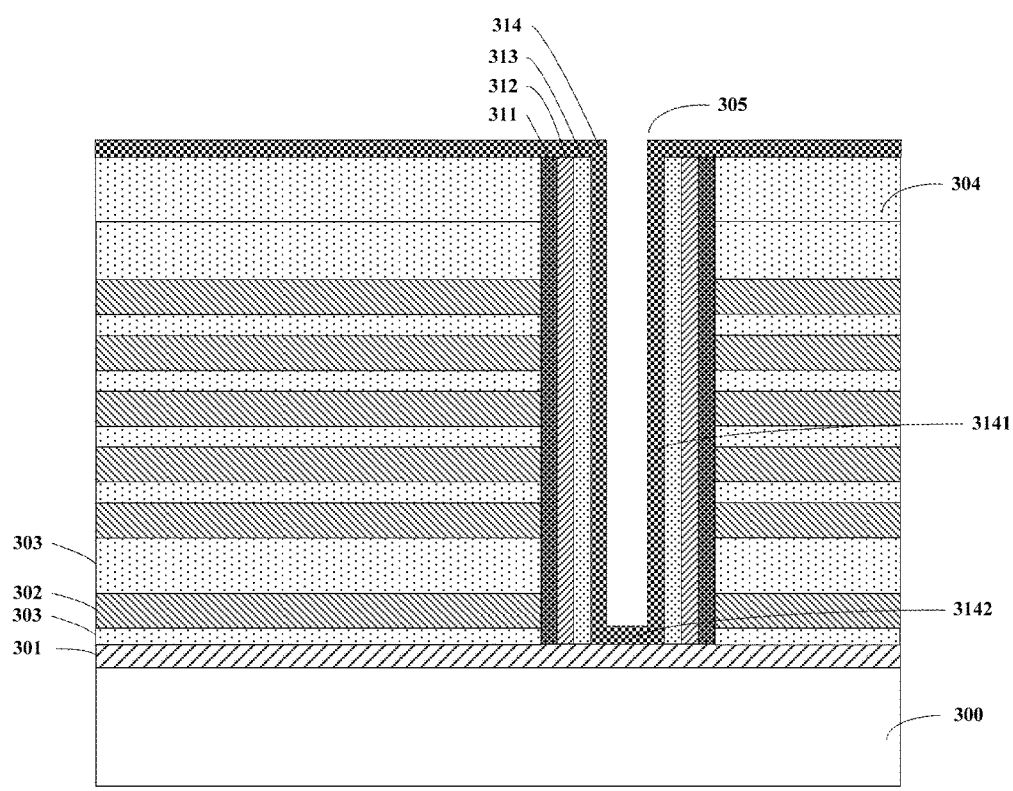

Next, referring to FIG. 3G, a channel layer 314 is formed on the side surface of tunneling insulator layer 313 and at the bottom of through hole 305, e.g., using a low-temperature deposition process. The low-temperature deposition process may be in the range between 350° C. and 400° C., e.g., 380° C. The channel layer may be an n-type polysilicon layer. As shown in FIG. 3G, channel layer 314 may include a first portion 3141 on the side surface of tunneling insulator layer 313 and a second portion 3142 on the bottom of the through hole.

Figure 3H:
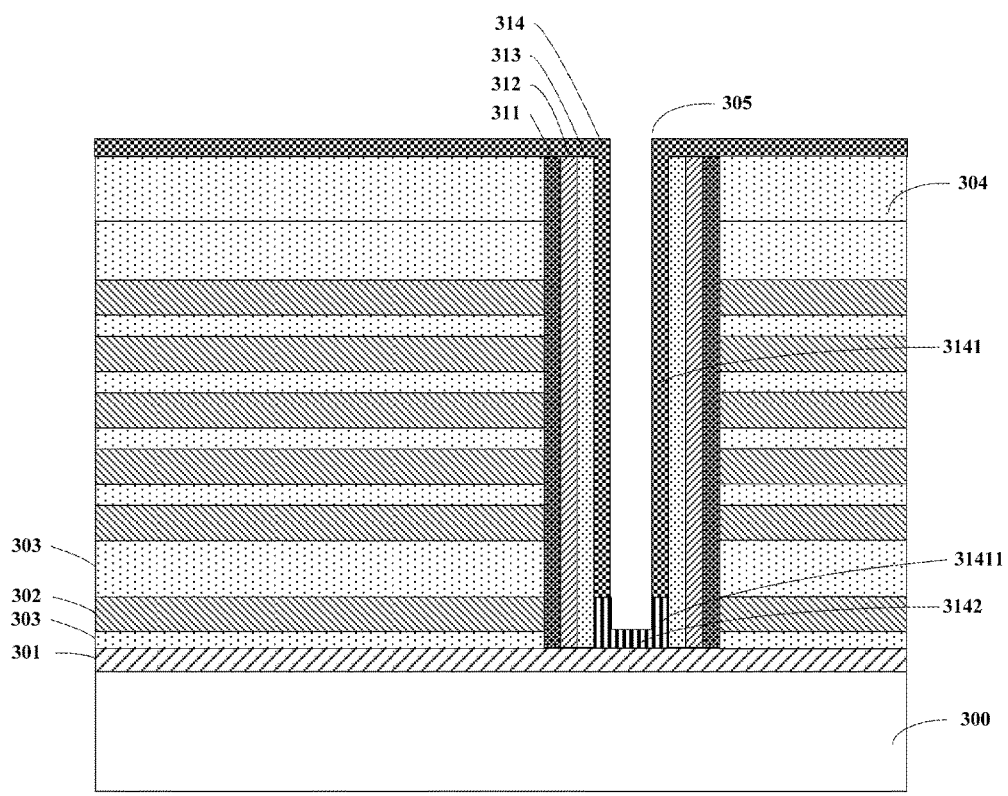

Next, referring to FIG. 3H, an MILC treatment (process) is performed on channel layer 314 using the electrode layer (where the electrode layer is a metal silicide layer) as a metal inducing layer. For example, the MILC process is performed at a temperature in the range between 200° C. and 400° C., and with a time duration that depends from applications, so that the grain size of a second portion 3142 of channel layer 314 and the grain size of a portion 31411 of a first portion 3141 adjacent to second portion 3142 become larger. Portion 31411 of first portion 3141 where the grain size has become larger is surrounded by the bottom sacrificial layer of the plurality of sacrificial layers.

Figure 3I:
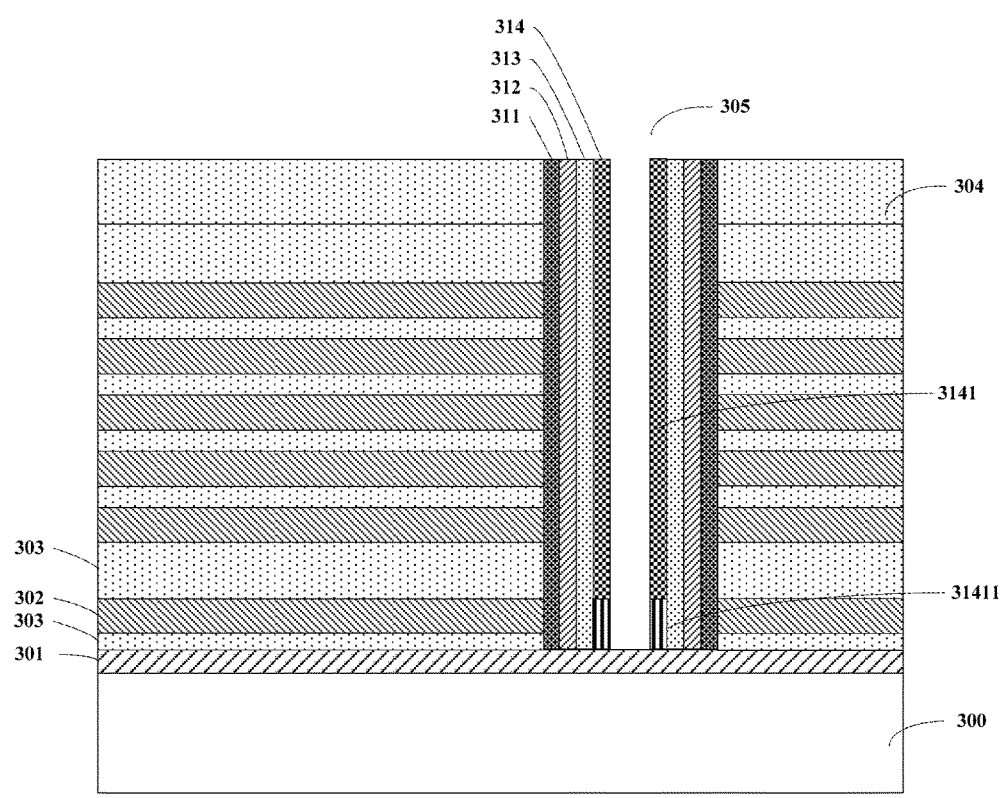

Next, referring to FIG. 3I, a portion of channel layer 314 on the upper surface of interlayer dielectric layer 304 is removed. In one embodiment, second portion 3142 of channel layer 314 may also be removed.

Figure 3J:
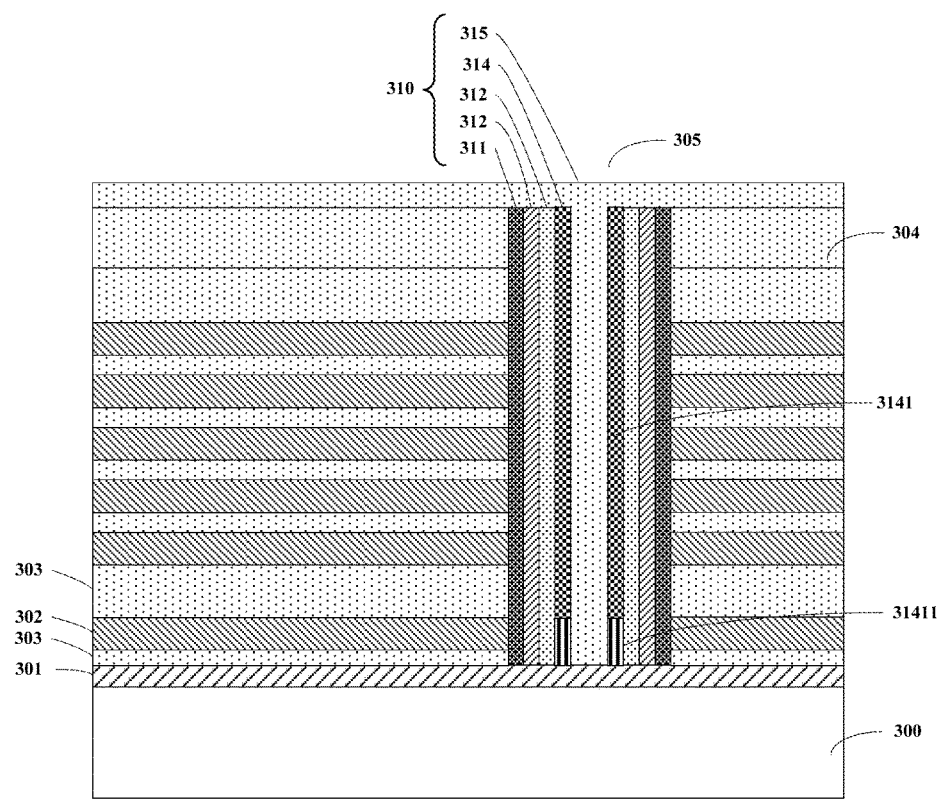

Next, referring to FIG. 3J, a channel core 315 is formed using, e.g., a deposition process to fill through hole 305. In one embodiment, a planarization process is performed on the channel core. In one embodiment, a portion of the channel core over the upper surface of interlayer dielectric layer 304 may also be removed. Thus, a channel structure 310 according to one embodiment is formed. Channel structure 310 may include a barrier layer 311, a charge trapping layer 312, a tunneling insulator layer 313, a channel layer 314, and a channel core 315.

Figure 3K:
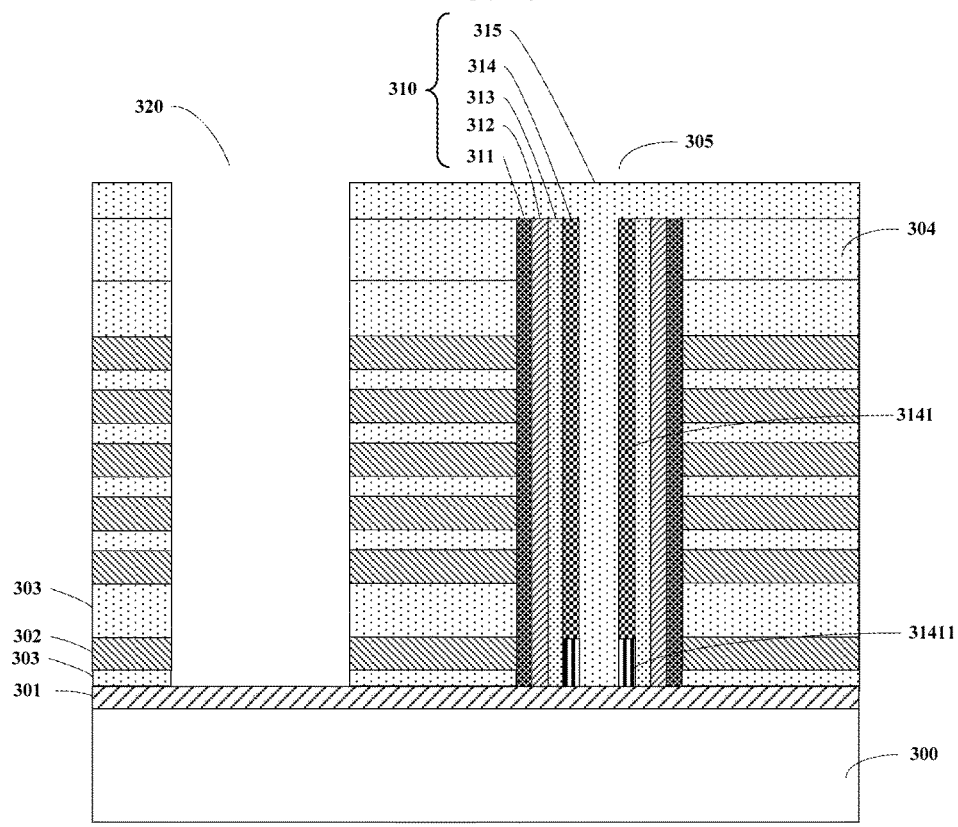

Next, referring to FIG. 3K, sacrificial layers 302 and spacer insulator layers 303 are etched to form a trench 320. The trench may be used to segment the stack of alternate layers of sacrificial layers 302 and spacer insulator layers 303 into different separate portions to form a plurality of memory cells, each of the memory cells includes a channel structure.

Figure 3L:
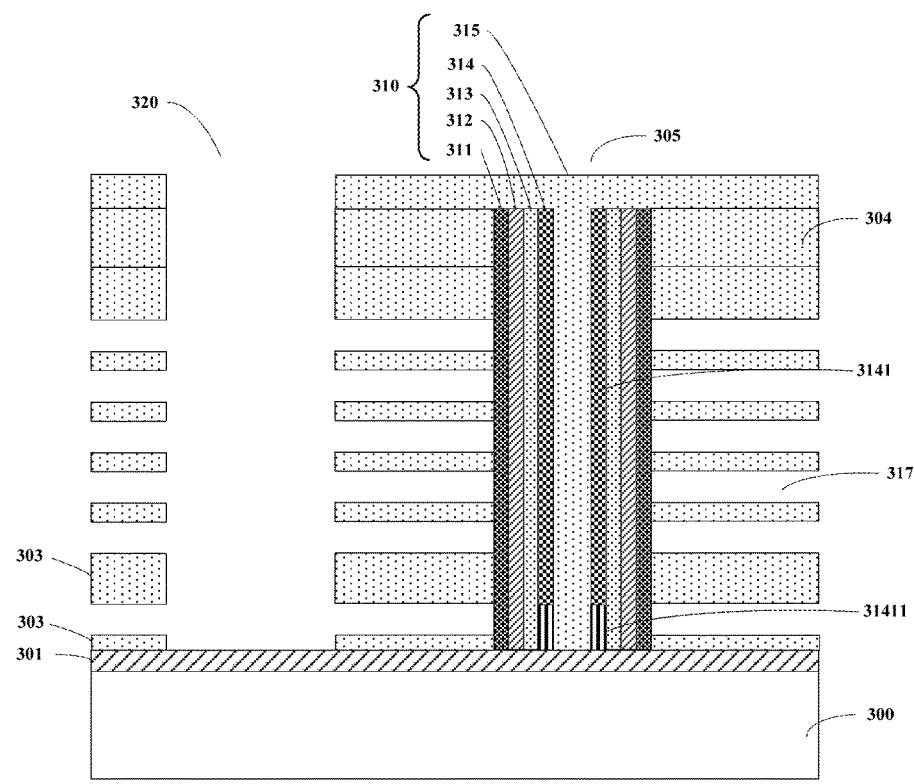

Next, referring to FIG. 3L, sacrificial layers 302 are removed, e.g., using an etching process, to form a plurality of voids 317.

Figure 3M:
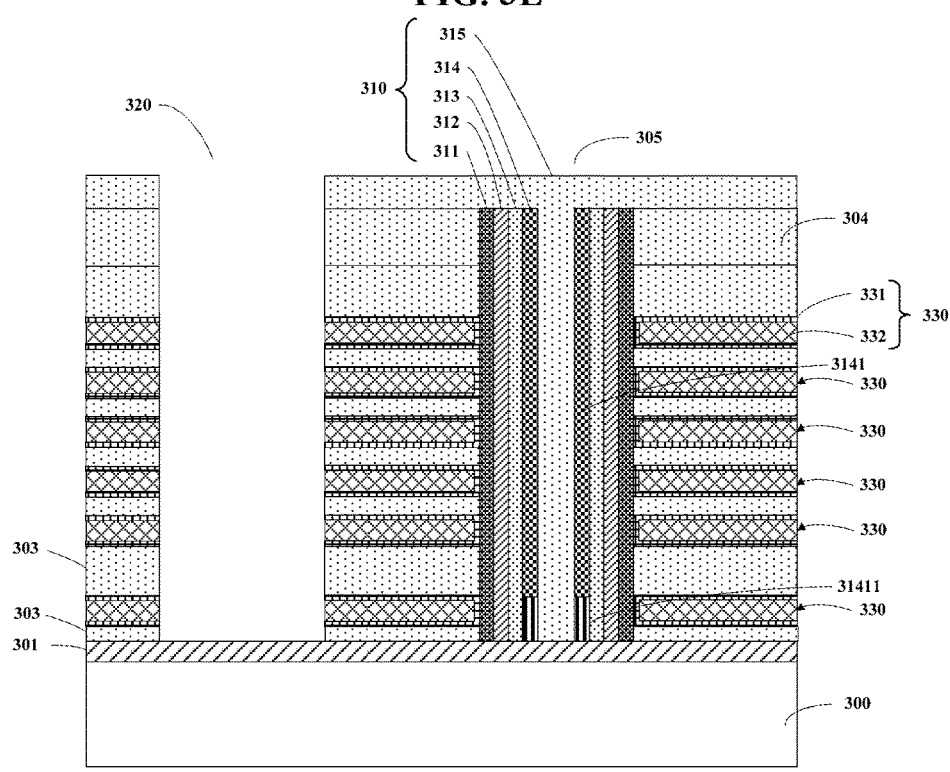

Next, referring to FIG. 3M, a plurality of gate structures 330 are formed in voids 317. Gate structures 330 each may include a gate 332 that surrounds the channel structure and a gate work function adjusting layer 331 on the surface of gate 332. A portion of gate work function adjusting layer 331 is disposed between the gate and the channel structure. The gate may include a metal such as tungsten. The gate work function adjusting layer may include titanium nitride or titanium carbide. In some embodiments, in the process of forming the gate structure, a portion of the gate structure (e.g., a portion of the gate work function adjusting layer and a portion of the gate) may be formed in trench 320, so that the manufacturing method of the embodiment may include removing the portion of the gate structure formed in the trench using, e.g., an etching process.

Next, referring to FIG. 3N1, a sidewall spacer layer 341 is formed on sidewalls of trench 320. Forming the sidewall spacer layer may include forming a sidewall spacer layer on the bottom and sidewalls of the trench using, e.g., a deposition process, and then removing the portion of the sidewall spacer layer on the bottom of the trench using a back etch process. For example, the sidewall spacer layer may include silicon dioxide. After forming sidewall spacer layer 341, a metal connecting member 342 is formed in trench 320 connecting to electrode layer 301 by a chemical vapor deposition (CVD) process, as shown in FIG. 3N1. The metal connecting member may include a metal such as tungsten. In one embodiment, a planarization process may be performed on the metal connecting member. FIG. 3N2 is a schematic cross-sectional view of the structure shown in FIG. 3N1 taken along the line D-D'. It should be noted that, in some embodiments, since the step of removing a portion of channel core 315 on interlayer dielectric layer 204 may be included in the preceding steps, the portion of channel core 315 on the on the interlayer dielectric layer may not be shown in FIG. 3N2.

Figure 3O:
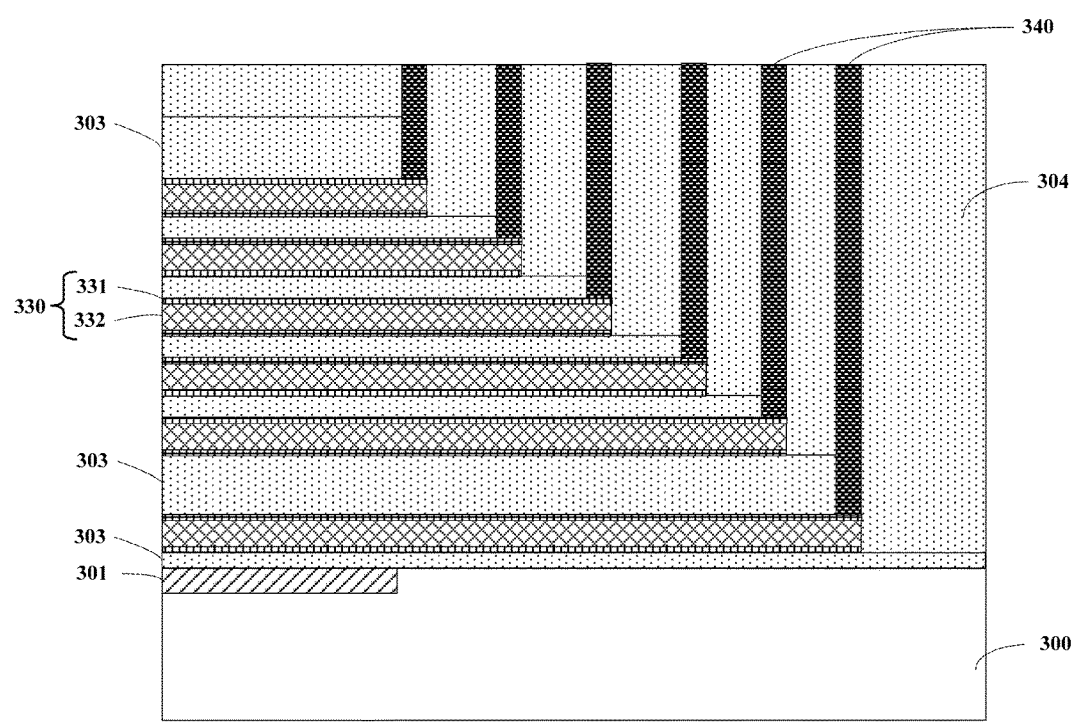

Next, referring to FIG. 3O, a plurality of gate contacts 340 are formed, each of the gate contacts is connected to one of gate structures 330. For example, interlayer dielectric layer 304 is etched (e.g., using a photolithography and etching process) to form an opening exposing gate structures 330, and then the plurality of gate contacts are formed in the opening using, e.g., a deposition process. For example, the gate contacts each may include a work function adjusting layer (e.g., titanium nitride, titanium carbide) on the sidewalls and bottom of the opening and a meal layer (e.g., tungsten) on the work function adjusting layer.

Thus, a method of manufacturing a flash memory device according to one embodiment of the present invention is provided. In the manufacturing process of the flash memory device, the metal silicide layer is used as the electrode layer to form the source or the drain of the bottom transistor. The flash memory device according to the manufacturing method can be manufactured in a back-end-of-line process after forming a logic circuit, and therefore, the manufacturing process has a better compatibility with the back-end-of-line process. Using the above-described manufacturing method, nonvolatile memory devices compatible with the back-end-of-line process of the logic circuit can be manufactured, which significantly improves the degree of integration of nonvolatile memory devices comparing with conventional process techniques for embedded NAND flash memory devices.

In some embodiments, the above-described method may further include forming channel contacts in contact with the channel layer, and word lines connected to the channel contacts. The channel contacts and the word lines may be formed using conventional process techniques and will not be described herein for the sake of brevity.

Embodiments of the present invention also provide a flash memory device. Referring to FIG. 3N1, the flash memory device may include a substrate 300, and an electrode layer 301 on a portion of a substrate 300. Substrate 300 may include a silicon substrate or a dielectric layer. Electrode layer 301 may be a metal silicide layer, e.g., the metal silicide layer may include a nickel-silicon compound. In one embodiment, electrode layer 301 is embedded in substrate 300 and has an upper surface substantially flush with the upper surface of substrate 300 (not shown in FIG. 3N1, the positional relationship between the electrode layer and the substrate is shown in FIG. 3B). In the flash memory device shown in FIG. 3N1, the metal silicide layer is used as the metal inducing layer of the MILC process to obtain a larger grain size of the channel layer. Polysilicon thin film transistors (TFT) with larger crystal grain sizes can be used as control switches for the vertical columns of memory cells.

The flash memory device also includes a memory cell 350. As used herein, "a memory cell" refers to a component of a memory device. Non-limiting examples of memory devices include flash memory devices (e.g., a NAND flash memory device). The memory cell of the invention may be a structure portion of a three-dimensional memory device, e.g., a string of memory cells having a SSL gate at the top (the top gate structure) and a GSL gate at the bottom (the bottom gate structure).

Referring to FIG. 3N1, memory cell 350 may include a channel structure 310 on electrode layer 301. Channel structure 310 may include, in this order from the inside to the outside, a channel layer 314 in contact with electrode layer 301, a tunneling insulator layer 313 surrounding the surface of channel layer 314, a charge trapping layer 312 surrounding the surface of tunneling insulator layer 313, and a barrier layer 311 surrounding the surface of charge trapping layer 312. Channel layer 314 may include a semiconductor material (e.g., polysilicon). Tunneling insulator layer 313 may include silicon oxide. Charge trapping layer 312 may include silicon nitride. Barrier layer 311 may include silicon oxide.

In one embodiment, in the case where electrode layer 301 is a metal silicide layer, a portion 31411 of channel layer 314 adjacent to electrode layer 301 is a polysilicon portion that is subjected to the MILC process treatment, wherein the polysilicon portion is surrounded by a bottom gate structure of a plurality of gate structures 330 (to be described later below).

In some embodiments, the charge trapping layer may completely surrounds the tunneling insulator layer or partially surrounds the tunneling insulator layer.

In one embodiment, the channel structure may further include a channel core 315 surrounded by channel layer 314. Channel core 315 may include silicon dioxide.

Referring still to FIG. 3N1, memory cell 350 may further include multiple gate structures 330 surrounding the channel structure along the axial direction of channel structure 310. In one embodiment, gate structures 330 each may include a gate 332 that surrounds the channel structure and a gate work function adjusting layer 331 on the surface of gate 332. A portion of gate work function adjusting layer 331 is disposed between the gate and the channel structure. Gates may include a metal such as tungsten. The gate work function adjusting layer may include titanium nitride or titanium carbide. As used herein, the term "axial direction" refers to the direction along which the channel structure extends, that is, the flow of an electrical current flowing through the channel layer when the flash memory device is operating. In the example shown in FIG. 3N1, the axial direction of the channel structure is perpendicular to the upper surface of the substrate. Electrode layer 301 includes an NiSi layer configured to be a common source for the bottom select transistors of the memory device. Thus, the bottom select transistor is a TFT having a silicide source, a polysilicon drain and an MILC polysilicon channel. The bottom gate structure is the gate select line (GSL) of the bottom select transistor. The MILC polysilicon channel is turned on when a positive voltage is applied to the GSL (gate induced grain barrier lowering). Thus, the GSL functions as the switch to turn on the bottom select transistor for the vertical strings of cells.

In one embodiment, memory cell 350 may also include a spacer insulator layer 303 disposed between adjacent gate structures. Spacer insulator layer 303 may include silicon dioxide.

In one embodiment, the gate structures and the spacer insulator layers may form a step-shaped structure (e.g., shown in FIG. 3O). The flash memory cell may also include gate contacts 340 connected to the gate structures. The flash memory device may also include an interlayer dielectric layer 304 surrounding gate contacts 340.

In one embodiment, the flash memory device may include a plurality of memory cells 350 spaced apart from each other. For example, the flash memory device may include four or eight memory cells, this configuration facilitates the compatibility of the flash memory device with the dielectric layer between the metal layers in the back-end of line process of the logic circuit. The flash memory device may further include a metal connecting member 342 disposed between adjacent memory cells and connected to electrode layer 301, and a sidewall spacer layer 341 separating metal connecting member 342 from gate structures 330, as shown in FIG. 3N1. Metal connecting member 342 may include a metal such as tungsten. Sidewall spacer layer 341 may include silicon dioxide.

The following describes a process of storing data in a flash memory device according to one embodiment of the present invention. The electrode layer is in contact with the channel layer forming a Schottky contact. For a column of memory cells that needs to store data, a metal connecting member corresponding to the memory cell, a top portion of the channel layer (e.g., a channel contact), and a gate of the bottom transistor of the memory cell are activated, so that the Schottky contact becomes an ohmic contact, and thus, a working current flows through the channel layer. In the case where a certain gate of the memory cell is activated, carriers (e.g., electrons) are tunneled through the tunneling insulator layer into the corresponding charge trapping layer, thereby enabling the data storage.

Embodiments of the present invention have been described in detail. In order not to obscure the teachings of the present invention, some details known in the art are omitted. Those of skill in the art will appreciate variations from these embodiments will fall within the scope of the present invention.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A flash memory device, comprising:
  a substrate;
  an electrode layer on a portion of the substrate, the electrode layer being a work function adjusting layer or a metal silicide layer; and
  a memory cell comprising:
    a channel structure in direct contact with the electrode layer and comprising, from an inside to an outside and from top to bottom, a doped channel layer in contact with the electrode layer, a tunneling insulator layer surrounding an entire surface of the doped channel layer along an axial direction of the channel structure, a charge trapping layer surrounding an entire surface of the tunneling insulator layer along the axial direction of the channel structure, and a barrier layer surrounding an entire surface of the charge trapping layer along the axial direction of the channel structure; and
    a plurality of gate structures surrounding the channel structure along the axial direction of the channel structure,
    wherein the doped channel layer comprises a lower portion adjacent the electrode layer and an upper portion, the lower portion comprising a grain size larger than a grain size of the upper portion.

2. The flash memory device of claim 1, wherein the doped channel layer comprises n-type polysilicon, and the work function adjusting layer comprises titanium carbide or titanium-aluminum alloy; or
  the doped channel layer comprises p-type polysilicon, and the work function adjusting layer comprises titanium nitride.

3. The flash memory device of claim 1, wherein the metal silicide layer comprises a nickel-silicon compound.

4. The flash memory device of claim 1, wherein the lower portion of the doped channel layer adjacent to the electrode layer is a polysilicon portion being surrounded by a gate structure at a bottom of the plurality of gate structures.

5. The flash memory device of claim 1, wherein:
the substrate comprises a silicon substrate or a dielectric layer;
the tunneling insulator layer comprises silicon oxide;
the charge trapping layer comprises silicon nitride; and
the barrier layer comprises silicon oxide.

6. The flash memory device of claim 1, wherein the electrode layer is embedded in the substrate and has an upper surface flush with an upper surface of the substrate.

7. The flash memory device of claim 1, wherein the channel structure further comprises a silicon oxide channel core surrounded by the doped channel layer.

8. The flash memory device of claim 1, wherein the memory cell further comprises a spacer insulator layer disposed between adjacent gate structures.

9. The flash memory device of claim 1, further comprising:
a plurality of memory cells spaced apart from each other;
a metal connecting member disposed between adjacent memory cells and connected to the electrode layer; and
a sidewall spacer layer disposed between the metal connecting member and the gate structures.

10. The flash memory device of claim 1, wherein each of the plurality of gate structures comprises a gate surrounding the channel structure and a gate work function adjusting layer disposed between the gate and the channel structure, the gate comprising tungsten, and the gate work function adjusting layer comprising titanium nitride or titanium carbide.

11. A method of manufacturing a flash memory device, comprising:
providing a substrate;
forming an electrode layer on a portion of the substrate, the electrode layer being a work function adjusting layer or a metal silicide layer;
forming a plurality of sacrificial layers alternating with a plurality of spacer insulator layers on the electrode layer;
etching the sacrificial layers and the spacer insulator layers to form a through hole exposing a surface of the electrode layer;
forming a channel structure in the through hole comprising, from an inside to an outside, a channel layer in contact with the electrode layer, a tunneling insulator layer surrounding a surface of the channel layer, a charge trapping layer surrounding a surface of the tunneling insulator layer, and a barrier layer surrounding a surface of the charge trapping layer;
subjecting the channel layer to a metal induced lateral crystal (MILC) treatment using the electrode layer as a metal inducing layer, such that a grain size of a bottom portion of the channel layer in contact with the electrode layer and a portion of the channel layer adjacent to the bottom portion and surrounded by a sacrificial layer at a bottom of the plurality of sacrificial layers become larger;
removing the sacrificial layers to form a plurality of voids; and
forming a plurality of gate structures in the plurality of voids.

12. The method of claim 11, wherein the channel layer comprises n-type polysilicon, and the work function adjusting layer comprises titanium carbide or titanium-aluminum alloy; or
the channel layer comprises p-type polysilicon, and the work function adjusting layer comprises titanium nitride.

13. The method of claim 11, wherein the metal silicide layer comprises a nickel-silicon compound.

14. The method of claim 11, wherein forming the channel structure in the through hole comprises:
forming the barrier layer on sidewalls of the through hole;
forming the charge trapping layer on the surface of the barrier layer;
forming the tunneling insulator layer on the surface of the charge trapping layer;
forming the channel layer on the surface of the tunneling insulator layer and on a bottom of the through hole.

15. The method of claim 14,
further comprising removing the bottom portion of the channel layer.

16. The method of claim 14, wherein forming the channel structure in the through hole further comprises, after forming the channel layer:
forming a channel core filling the through hole.

17. The method of claim 11, wherein the MILC treatment is performed at a temperature in a range between 200° C. and 400° C.

18. The method of claim 11, wherein:
the substrate comprises a silicon substrate or a dielectric layer;
the tunneling insulator layer comprises silicon oxide;
the charge trapping layer comprises silicon nitride; and
the barrier layer comprises silicon oxide.

19. The method of claim 11, wherein the electrode layer is embedded in the substrate and has an upper surface flush with an upper surface of the substrate.

20. The method of claim 11, further comprising, after forming the channel structure and prior to removing the plurality of sacrificial layers:
etching the sacrificial layers and the spacer insulation layers to form a trench exposing the electrode layer;
after forming the plurality of gate structures, forming a sidewall spacer layer on sidewalls of the trench; and
forming a metal connecting member in the trench connected to the electrode layer.

* * * * *